US012749657B2

(12) United States Patent
Sawachi et al.

(10) Patent No.: US 12,749,657 B2
(45) Date of Patent: Sep. 29, 2026

(54) GAS SUPPLY SYSTEM, GAS CONTROL SYSTEM, PLASMA PROCESSING APPARATUS, AND GAS CONTROL METHOD

(71) Applicant: Tokyo Electron Limited, Tokyo (JP)

(72) Inventors: Atsushi Sawachi, Miyagi (JP); Kota Ishiharada, Miyagi (JP); Hideaki Yakushiji, Miyagi (JP); Yoshiyasu Sato, Miyagi (JP); Shinya Morikita, Miyagi (JP); Shota Yoshimura, Miyagi (JP); Toshihiro Tsuruta, Miyagi (JP); Kazuaki Takaai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 386 days.

(21) Appl. No.: 18/433,862

(22) Filed: Feb. 6, 2024

(65) Prior Publication Data

US 2024/0212987 A1 Jun. 27, 2024

Related U.S. Application Data

(63) Continuation-in-part of application No. PCT/JP2022/028262, filed on Jul. 20, 2022.

(Continued)

(30) Foreign Application Priority Data

Aug. 6, 2021 (JP) ................................ 2021-130368
Aug. 24, 2021 (JP) ................................ 2021-136662
Oct. 29, 2021 (JP) ................................ 2021-178180

(51) Int. Cl.
*H01J 37/32* (2006.01)
*H10P 72/00* (2026.01)

(52) U.S. Cl.
CPC .. *H01J 37/32449* (2013.01); *H01J 37/32834* (2013.01); *H10P 72/0402* (2026.01); *H01J 2237/334* (2013.01)

(58) Field of Classification Search
CPC ........... H01J 37/32449; H01J 37/32834; H01J 2237/334; H10P 72/0402
See application file for complete search history.

(56) References Cited

FOREIGN PATENT DOCUMENTS

CN 101032008 A * 9/2007 ............. H10P 95/00
JP 2016-201530 A 12/2016

(Continued)

OTHER PUBLICATIONS

International Search Report and Written Opinion mailed on Sep. 13, 2022, received for PCT Application PCT/JP2022/028262, filed on Jul. 20, 2022, 09 pages including English Translation.

*Primary Examiner* — Henry Luong
(74) *Attorney, Agent, or Firm* — XSENSUS LLP

(57) ABSTRACT

A gas supply system includes: gas supply flow paths for independently supplying gas to a processing chamber; a flow rate controller arranged in each gas supply flow path; a primary-side valve arranged on an upstream side of the flow rate controller; a primary-side gas exhaust flow path branched between the primary-side valve and the flow rate controller; a primary-side exhaust valve arranged in the primary-side gas exhaust flow path; a secondary-side valve arranged on a downstream side of the flow rate controller; a secondary-side gas exhaust flow path branched between the secondary-side valve and the flow rate controller; and a secondary-side exhaust valve arranged in the secondary-side gas exhaust flow path. The flow rate controller includes: a control valve connected to the primary-side valve and the secondary-side valve; and a control-side orifice arranged between the control valve and the secondary-side valve.

17 Claims, 21 Drawing Sheets

Related U.S. Application Data

(60) Provisional application No. 63/539,465, filed on Sep. 20, 2023.

(56) References Cited

FOREIGN PATENT DOCUMENTS

| | | | |
|---|---|---|---|
| KR | 10-20160040285 | A | 4/2016 |
| KR | 10-20160120660 | A | 10/2016 |
| KR | 10-20210025514 | A | 3/2021 |

* cited by examiner

GAS SUPPLY SYSTEM, GAS CONTROL SYSTEM, PLASMA PROCESSING APPARATUS, AND GAS CONTROL METHOD

CROSS-REFERENCE TO RELATED APPLICATIONS

This application is a continuation-in-part application of International Application No. PCT/JP2022/028262 having an international filing date of Jul. 20, 2022, which claims the benefits of priorities from Japanese Patent Application Nos. 2021-130368, 2021-136662 and 2021-178180, filed on Aug. 6, 2021, Aug. 24, 2021 and Oct. 29, 2021, respectively, the entire contents of each are incorporated herein by reference. This application also claims priority to U.S. Provisional Application No. 63/539,465, filed on Sep. 20, 2023.

TECHNICAL FIELD

The present disclosure relates to a gas supply system, a gas control system, a plasma processing apparatus, and a gas control method.

BACKGROUND

Patent Document 1 discloses a gas supply control method using a pressure-controlled flowmeter provided in a gas supply line, a first valve provided on the upstream side of the pressure-controlled flowmeter in the gas supply line, and a second valve provided on the downstream side of the pressure-controlled flowmeter in the gas supply line. In addition, as an example, the pressure-controlled flowmeter disclosed in Patent Document 1 includes a control valve connected to the first valve and the second valve, and an orifice provided between the control valve and the second valve.

PRIOR ART DOCUMENT

Patent Document

Patent Document 1: Japanese Laid-Open Patent Publication No. 2016-201530

SUMMARY

An aspect of the present disclosure provides a gas supply system for supplying gas into a processing chamber, which includes a plurality of gas supply flow paths configured to independently supply the gas to the processing chamber; a flow rate controller arranged in each of the plurality of gas supply flow paths; a primary-side valve arranged on an upstream side of the flow rate controller in each of the plurality of gas supply flow paths; a primary-side gas exhaust flow path which is branched between the primary-side valve and the flow rate controller in each of the plurality of gas supply flow paths and is connected to a primary-side exhaust mechanism; a primary-side exhaust valve arranged in the primary-side gas exhaust flow path; a secondary-side valve arranged on a downstream side of the flow rate controller in each of the plurality of gas supply flow paths; a secondary-side gas exhaust flow path which is branched between the secondary-side valve and the flow rate controller in each of the plurality of gas supply flow paths and is connected to a secondary-side exhaust mechanism; and a secondary-side exhaust valve arranged in the secondary-side gas exhaust flow path, wherein the flow rate controller includes a control valve connected to the primary-side valve and the secondary-side valve, and a control-side orifice arranged between the control valve and the secondary-side valve.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, a semiconductor substrate (hereinafter, referred to as a "wafer") placed in an internal space of a chamber is subjected to various gas processes such as etching, film formation, and cleaning under a desired gas atmosphere. In these gas processes, it is important to precisely control a flow rate of gas supplied to the internal space of the chamber in order to obtain desired gas process results for a wafer to be processed.

Patent Document 1 discloses a gas supply control method using a pressure-controlled flowmeter that controls the flow rate of gas supplied to the internal space of the chamber. According to the gas supply control method disclosed in Patent Document 1, for example, by controlling the opening/closing of a first valve and a second valve provided on the upstream and downstream sides of the pressure-controlled flowmeter, respectively, the supply of gas to the internal space of the chamber and the cutoff of the gas are repeated to alternately perform an etching process and a deposition process on a wafer.

Between the above-mentioned etching process and deposition process, that is, while the supply of the gas to the internal space of the chamber is stopped, a gas supply flow path (the pressure-controlled flowmeter) is evacuated in order to appropriately supply the gas to the internal space of the chamber in a subsequent process. The evacuation of the interior of the gas supply flow path is performed by using, for example, a vacuum line connected between an orifice provided in the pressure-controlled flowmeter and the first valve (see Patent Document 1: Type 1) or an exhaust line connected to the downstream side of the chamber (Type 2).

Figure 1:
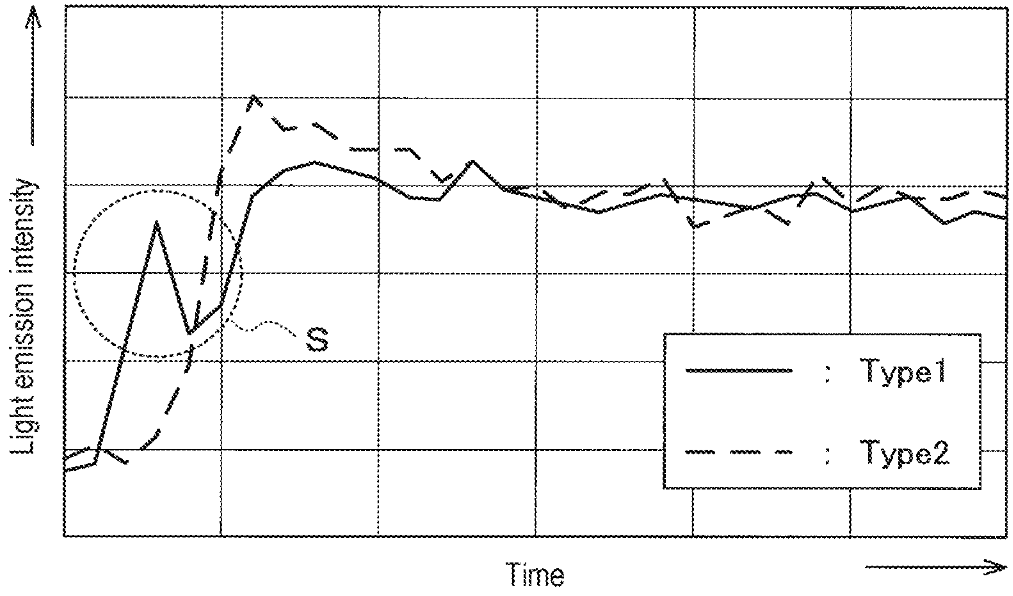
FIG. 1 is a graph illustrating how a spike occurs at the start of processing.
Figure 2:
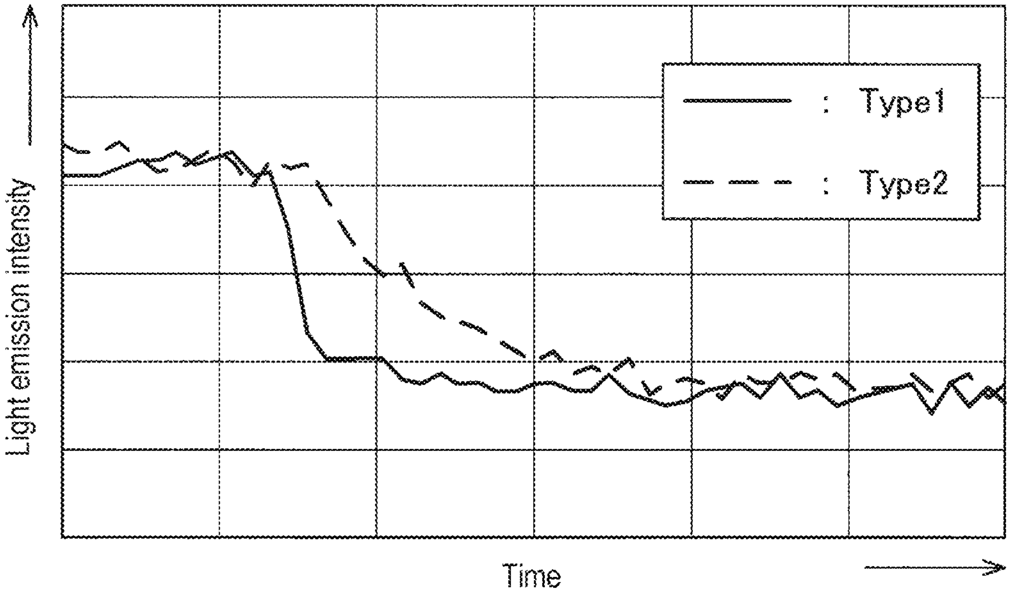
FIG. 2 is a graph illustrating how gas fall deteriorates at the end of the processing.

However, in the case where the pressure-controlled flowmeter is provided with an orifice as described above, the supply flow path may not be appropriately evacuated by using the evacuation methods in the related art (Type 1, Type 2), which may affect a processing process on the wafer. Specifically, for example, when exhaust is performed from the upstream side of the orifice as in the above-mentioned Type 1, gas may remain in the supply flow path on the downstream side of the orifice, and as illustrated in FIG. 1, a spike S may occur at the beginning of the process. In addition, for example, when exhaust is performed from the downstream side of the orifice as in the above-mentioned Type 2, gas may remain on the upstream side of the orifice. Thus, as illustrated in FIG. 2, there is a risk that a fall responsiveness when the supply of the gas is stopped will deteriorate.

The technology according to the present disclosure has been made in view of the above circumstances, and appropriately exhausts gas from the interior of a flow rate controller that controls the flow rate of gas supplied into a processing chamber. Hereinafter, a wafer processing system including a gas supply system (a gas control system) and a plasma processing apparatus according to the present embodiment will be described with reference to the drawings.

In the specification and drawings, elements having substantially the same functional configurations will be denoted by the same reference numerals and redundant descriptions thereof will be omitted.

<Plasma Processing System>

Figure 3:
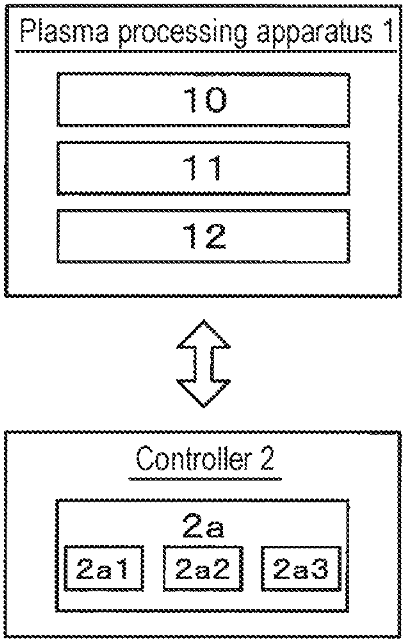
FIG. 3 is an explanatory view illustrating a configuration example of a plasma processing system according to an embodiment.

In an embodiment, the plasma processing system includes a plasma processing apparatus 1 and a controller 2, as illustrated in FIG. 3. The plasma processing system is an example of a substrate processing system, and the plasma processing apparatus 1 is an example of a substrate processing apparatus. The plasma processing apparatus 1 includes a plasma processing chamber 10, a substrate support 11, and a plasma generator 12. The plasma processing chamber 10 has a plasma processing space. In addition, the plasma processing chamber 10 includes at least one gas supply port configured to supply at least one gas to the plasma processing space, and at least one gas discharge port configured to discharge the gas from the plasma processing space. The gas supply port is connected to a gas supplier 20 to be described later, and the gas discharge port is connected to an exhaust system 40 to be described later. The substrate support 11 is arranged inside the plasma processing space and has a substrate support surface for supporting a substrate.

The plasma generator 12 is configured to generate plasma from the at least one processing gas supplied into the plasma processing space. The plasma formed in the plasma processing space may be capacitively coupled plasma (CCP), inductively coupled plasma (ICP), electron-cyclotron-resonance (ECR) plasma, helicon wave plasma (HWP), surface wave plasma (SWP), or the like. In addition, various types of plasma generators including an alternating current (AC) plasma generator and a direct current (DC) plasma generator may be used. In an embodiment, an AC signal (AC power) used in the AC plasma generator has a frequency in a range of 100 kHz to 10 GHz. Therefore, the AC signal includes a radio-frequency (RF) signal and a microwave signal. In an embodiment, the RF signal has a frequency in a range of 100 kHz to 150 MHz.

The controller 2 processes computer-executable commands that cause the plasma processing apparatus 1 to execute various processes described herein. The controller 2 may be configured to control each element of the plasma processing apparatus 1 to perform various processes described herein. In an embodiment, a portion or all of the controller 2 may be included in the plasma processing apparatus 1. The controller 2 may include, for example, a computer 2$a$. The computer 2$a$ may include, for example, a processor (a central processing unit (CPU)) 2$a$1, a storage

2_a_2, and a communication interface 2_a_3. The processor 2_a_1 may be configured to perform various control operations by reading a program from the storage 2_a_2 and executing the read program. This program may be stored in the storage 2_a_2 in advance, or may be acquired via a medium when necessary. The acquired program is stored in the storage 2_a_2, and read from the storage 2_a_2 and executed by the processor 2_a_1. The medium may be various storage media readable by the computer 2_a_, or may be a communication line connected to the communication interface 2_a_3. The storage 2_a_2 may include a random access memory (RAM), a read only memory (ROM), a hard disk drive (HDD), a solid state drive (SSD), or a combination thereof. The communication interface 2_a_3 may communicate with the plasma processing apparatus 1 via a communication line such as a local area network (LAN). The above program may be one that has been recorded on a storage medium readable by the computer 2_a_, and may be installed in the controller 2 from the storage medium. In addition, the storage medium may be either transitory or non-transitory.

<Plasma Processing Apparatus>

Figure 4:
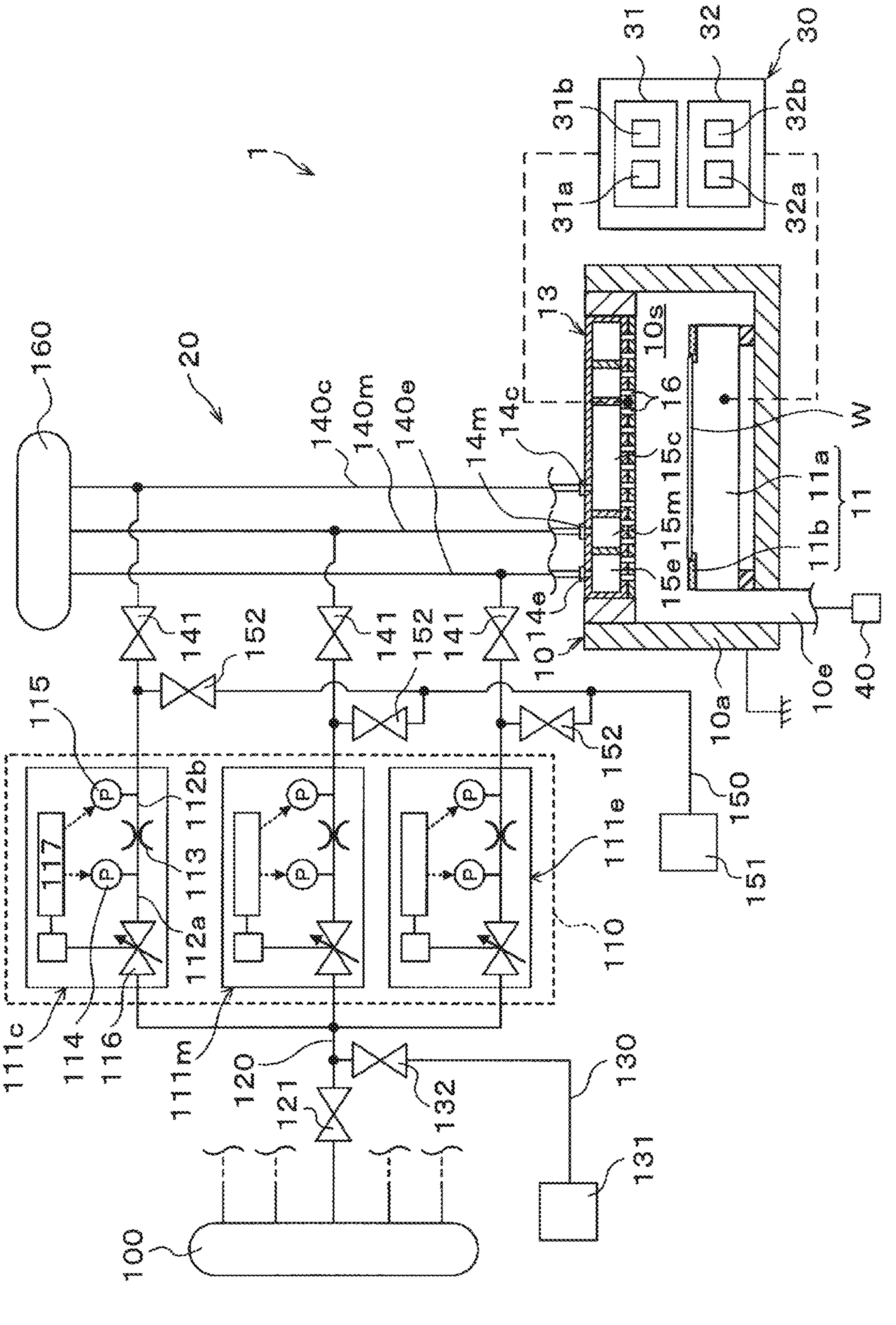
FIG. 4 is a cross-sectional view illustrating a configuration example of a plasma processing apparatus according to an embodiment.

Next, as an example of the plasma processing apparatus 1 described above, a configuration example of a capacitively coupled plasma processing apparatus 1 will be described. FIG. 4 is a vertical cross-sectional view illustrating an outline of the configuration of the plasma processing apparatus 1.

The plasma processing apparatus 1 includes a plasma processing chamber 10, a gas supplier 20, a power supply 30, and the exhaust system 40. In addition, the plasma processing apparatus 1 includes a substrate support 11 and a gas introducer. The substrate support 11 is arranged inside the plasma processing chamber 10. The gas introducer is configured to introduce at least one gas into the plasma processing chamber 10. The gas introducer includes a shower head 13. The shower head 13 is arranged above the substrate support 11. In an embodiment, the shower head 13 constitutes at least a portion of the ceiling of the plasma processing chamber 10. Inside the plasma processing chamber 10, a plasma processing space 10_s_ is defined by the shower head 13, a sidewall 10_a_ of the plasma processing chamber 10, and the substrate support 11. In addition, the plasma processing chamber 10 includes at least one gas supply port configured to supply at least one processing gas to the plasma processing space 10_s_, and at least one gas discharge port configured to discharge the gas from the plasma processing space 10_s_. The plasma processing chamber 10 is grounded. The shower head 13 and the substrate support 11 are electrically insulated from the plasma processing chamber 10.

The substrate support 11 includes a main body 11_a_ and a ring assembly 11_b_. An upper surface of the main body 11_a_ has a central region for supporting a substrate W and an annular region for supporting the ring assembly 11_b_. A wafer is an example of the substrate W. The annular region surrounds the central region in a plan view. The substrate W is placed on the central region, and the ring assembly 11_b_ is placed on the annular region to surround the substrate W on the central region. Therefore, the central region is also called a substrate support surface for supporting the substrate W, and the annular region is also called a ring support surface for supporting the ring assembly 11_b_.

In an embodiment, the main body 11_a_ includes a base and an electrostatic chuck. The base includes a conductive member. The conductive member may function as a lower electrode. The electrostatic chuck is placed on the base. The electrostatic chuck includes a ceramic member and an electrostatic electrode arranged inside the ceramic member. The ceramic member has a central region. In an embodiment, the ceramic member has a central region as well. In addition, another member surrounding the electrostatic chuck, such as an annular electrostatic chuck or an annular insulating member, may have an annular region. In this case, the ring assembly 11_b_ may be placed on the annular electrostatic chuck or the annular insulating member, or may be placed on both the electrostatic chuck and the annular insulating member. An RF or DC electrode may also be placed inside the ceramic member. In this case, the RF or DC electrode functions as the lower electrode. When a bias RF signal or DC signal, which will be described later, is connected to the RF or DC electrode, the RF or DC electrode is also called a "bias electrode." In addition, both the conductive member of the base and the RF or DC electrode may function as the lower electrode.

The ring assembly 11_b_ includes one or more annular members. In an embodiment, the one or more annular members include one or more edge rings and at least one cover ring. The edge rings are made of a conductive material or an insulating material, and the cover ring is made of an insulating material.

Although not illustrated, the substrate support 11 may include a temperature regulation module configured to regulate at least one of the ring assembly 11_b_, the electrostatic chuck, and the substrate W to a target temperature. The temperature regulation module may include a heater, a heat transfer medium, a flow path, or a combination thereof. A heat transfer fluid, such as brine or gas, flows through the flow path. In an embodiment, the flow path is formed inside the base and one or more heaters are arranged within the ceramic member of the electrostatic chuck. In addition, the substrate support 11 may include a heat transfer gas supplier configured to supply a heat transfer gas (backside gas) between the rear surface of the substrate W and the central region.

The shower head 13 is configured to introduce at least one gas from the gas supplier 20 into the plasma processing space 10_s_. The shower head 13 includes a conductive member. The conductive member of the shower head 13 functions as an upper electrode. That is, the shower head 13 includes an upper electrode.

The shower head 13 has at least one gas supply port (three gas supply ports 14_c_, 14_m_, and 14_e_ in the present embodiment), at least one gas diffusion chamber (three gas diffusion chambers 15_c_, 15_m_, and 15_e_ in the present embodiment), and a plurality of gas introduction ports 16. The gas supplied from the gas supplier 20 to the gas supply port 14_c_ passes through the gas diffusion chamber 15_c_ and is supplied from the plurality of gas introduction ports 16 toward a central portion (center) region of the substrate W supported by the substrate support 11. The gas supplied from the gas supplier 20 to the gas supply port 14_e_ passes through the gas diffusion chamber 15_e_ and is supplied from the plurality of gas introduction ports 16 toward a peripheral (edge) region of the substrate W supported by the substrate support 11. The gas supplied from the gas supplier 20 to the gas supply port 14_m_ passes through the gas diffusion chamber 15_e_ and is supplied from the plurality of gas introduction ports 16 toward an intermediate (middle) region between the center region and the edge region of the substrate W supported by the substrate support 11.

In addition to the shower head 13, the gas introducer may include one or more side-gas injectors (SGIs) installed in one or more openings formed in the sidewall 10_a_.

Figure 5:
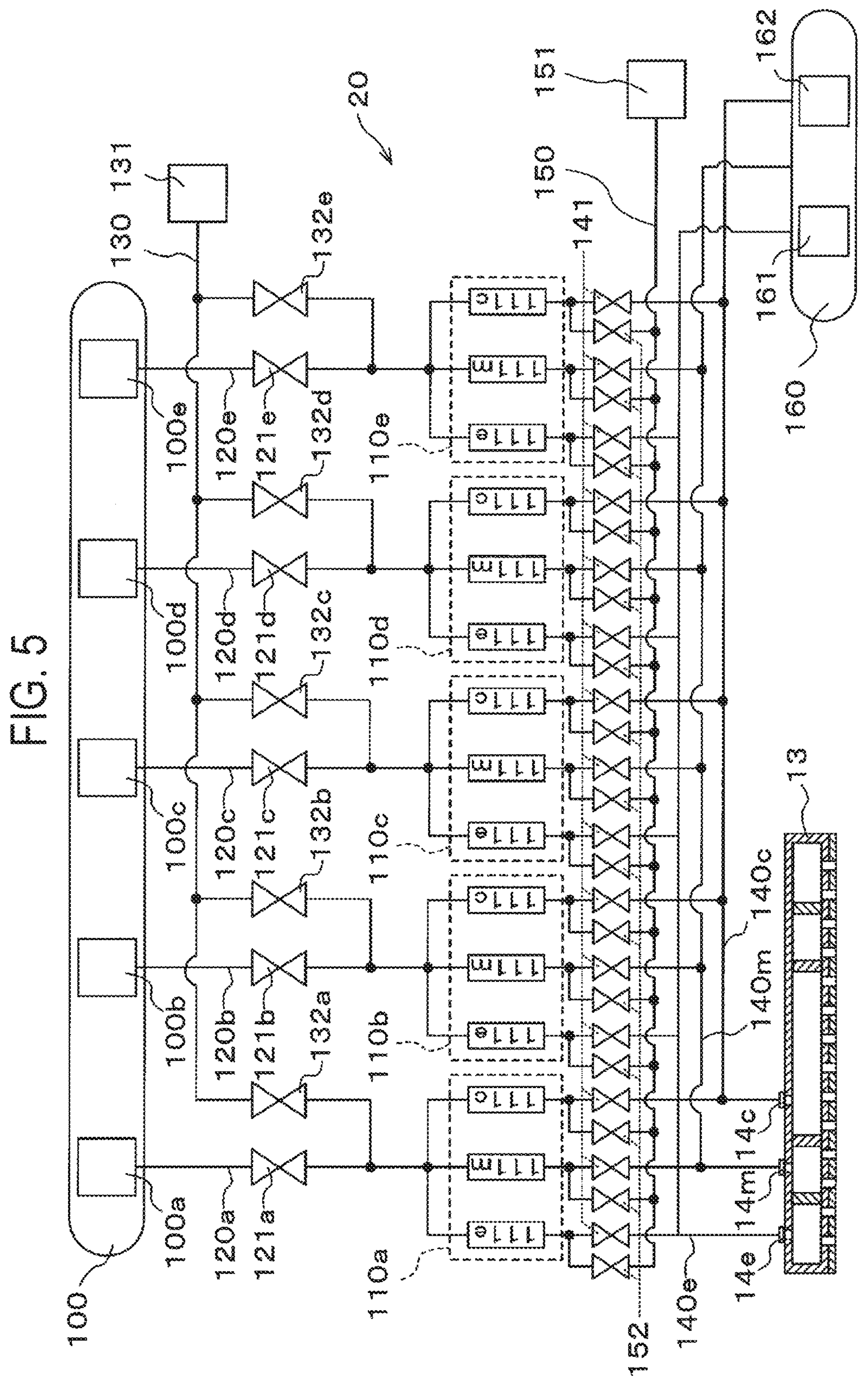
FIG. 5 is a system view illustrating a configuration example of a gas supplier according to an embodiment.

FIG. 5 is a system diagram illustrating a piping system of the gas supplier 20 as a gas supply system. In the following description, the side of a gas source 100 (to be described later) in the gas flow direction may be referred to as "primary-side" (upstream side), and the side of the shower head 13 in the gas flow direction may be referred to as "secondary-side" (downstream side). In FIG. 4, in order to prevent the illustration from becoming complicated, a plurality of flow rate control units 110*a* to 110*e* (to be described later) illustrated in FIG. 5 is illustrated as one flow rate control unit 110 with numbering "a" to "e" thereof omitted. That is, the flow rate control unit 110 illustrated in FIG. 4 is assumed to represent one of the flow rate control units 110*a* to 110*e*.

Similarly, in FIG. 4, since the configurations of the various members arranged to correspond to the respective flow rate control units 110*a* to 110*e* are the same, the numberings "a" to "e" in the various members are omitted. That is, it is assumed that various members illustrated in FIG. 4 are arranged to correspond to at least one of the flow rate control units 110*a* to 110*e*. Similarly, in the following description, the flow rate control units 110*a* to 110*e* and various members arranged to correspond thereto may be described while the numberings "a" to "e" are omitted.

As illustrated in FIG. 5, the gas supplier 20 includes at least one gas source (five gas sources 100*a* to 100*e* in the present embodiment), and at least one gas source (five flow rate control units 110*a* to 110*e* in the present embodiment) corresponding to respective gas sources 100*a* to 100*e*. In an embodiment, the gas supplier 20 is configured to supply different types of gases, which are output respectively from the five gas sources 100, to the shower head 13 via respective flow rate control units 110.

As illustrated in FIGS. 4 and 5, each flow rate control unit 110 is connected to a corresponding gas source 100 via a primary-side supply pipe 120 as a corresponding gas supply flow path. In addition, primary-side valves 121 corresponding to respective primary-side supply pipes 120 are arranged. By opening and closing the primary-side valves 121, the supply of gases from the gas sources 100 to respective flow rate control units 110 may be switched arbitrarily. In addition, any type of valves such as air-operated valves or electromagnetic valves may be used as the primary-side valves 121. From the viewpoint of improving responsiveness regarding gas supply, for example, the electromagnetic valves may be used.

In addition, between the primary-side valves 121 and the flow rate control units 110, that is, the primary-side supply pipes 120 on the downstream side of the primary-side valves 121 and the upstream side of the flow rate control units 110, an exhaust unit 131 is connected via a primary-side exhaust pipe 130. The exhaust unit 131 as a primary-side exhaust mechanism is provided in common to respective flow rate control units 110. In addition, in the primary-side exhaust pipe 130 as a primary-side gas exhaust flow path, primary-side exhaust valves 132 corresponding to respective flow rate control units 110 are arranged, and interiors of the flow rate control units 110 and the primary-side supply pipes 120 may be evacuated by opening/closing the primary-side exhaust valves 132. The exhaust unit 131 may include a vacuum pump. The vacuum pump may include a turbo molecular pump, a dry pump, or a combination thereof. In addition, the exhaust unit 131 may be used in common with the exhaust system 40 (to be described later) and an exhaust unit 151 (to be described later) that are connected to the plasma processing chamber 10. In addition, any type of valves such as air-operated valves or electromagnetic valves may be used as the primary-side exhaust valves 132. From the viewpoint of improving responsiveness regarding gas exhaust, for example, the electromagnetic valves may be used.

Each flow rate control unit 110 includes three pressure-controlled flow rate controllers 111*c*, 111*m*, and 111*e* (which may be simply referred to as a "flow rate controller 111") configured to control the flow rates of the gas supplied to respective three gas supply ports 14*c*, 14*m*, and 14*e* of the shower head 13. The three flow rate controllers 111 are each connected to an end portion of a branched primary-side supply pipe 120 (a branch supply pipe). In an example, the primary-side supply pipe 120 is branched into three branch supply pipes on the downstream side of the connection portion of the primary-side supply pipe 120 with the primary-side exhaust pipe 130.

The configuration of the flow rate controller 111 will be described with reference to FIG. 4. Since the configurations of the flow rate controllers 111*c*, 111*m*, and 111*e* are the same, in FIG. 4, for the sake of convenience in illustration, numberings may be omitted for elements having the same functional configuration.

Each flow rate controller 111 includes an internal supply pipe 112, an orifice 113, two pressure sensors 114 and 115, a control valve 116, and a control circuit 117. The internal supply pipe 112 as a gas supply flow path includes a primary-side internal supply pipe 112*a* on the upstream side and a secondary-side internal supply pipe 112*b* on the downstream side, with respect to the orifice 113 as a boundary.

The primary-side internal supply pipe 112*a* is connected to the aforementioned primary-side supply pipe 120 on the primary side and connected to the orifice 113 on the secondary side. In addition, the secondary-side internal supply pipe 112*b* is connected to the orifice 113 at the primary side, and connected to a secondary-side supply pipe 140 (to be described later) at the secondary side. In other words, the orifice 113 is provided between the primary-side internal supply pipe 112*a* and the secondary-side internal supply pipe 112*b*.

The two pressure sensors 114 and 115 measure internal pressures of the primary-side internal supply pipe 112*a* and the secondary-side internal supply pipe 112*b*, that is, pressures on the upstream and downstream sides of the orifice 113, respectively. Hereinafter, the internal pressure of the primary-side internal supply pipe 112*a* measured by the pressure sensor 114 will be referred to as "internal pressure P1," and the internal pressure of the secondary-side internal supply pipe 112*b* measured by the pressure sensor 115 will be referred to as "internal pressure P2."

The control valve 116 controls the flow rate of the gas flowing through the internal supply pipe 112 and supplied into the plasma processing chamber 10 (the shower head 13) by being controlled by the control circuit 117 in terms of the opening degree thereof. More specifically, by controlling the opening degree of the control valve 116 by the control circuit 117 to regulate the internal pressure P1 of the primary-side internal supply pipe 112*a*, the flow rate of the gas flowing through the downstream side of the orifice 113 (the secondary-side internal supply pipe 112*b*) is controlled to be maintained at a desired value determined according to the purpose of substrate processing in the plasma processing chamber 10.

In addition, the control valve 116 may function as a flow rate modulation device that modulates or pulses the flow rate of at least one gas under the control of the control circuit 117.

The following is a description of the gas supplier 20.

As illustrated in FIGS. 4 and 5, each flow rate controller 111*c,* 111*m,* or 111*e* is connected, via a secondary-side supply pipe 140*c,* 140*m,* or 140*e* as a gas supply flow path corresponding thereto, to one of the gas supply ports 14*c,* 14*m,* and 14*e* of a corresponding shower head 13. In addition, a corresponding secondary-side supply pipe 140 is arranged in each of the secondary-side valves 141. By opening and closing the primary-side valves 141, the supply of the gas from each flow rate controller 111 to the shower head 13 may be switched arbitrarily. In addition, any type of valves such as air-operated valves or electromagnetic valves may be used as the secondary-side valves 141. From the viewpoint of improving responsiveness regarding gas supply, for example, the electromagnetic valves may be used. In the plasma processing apparatus 1 according to the present embodiment, other valves (for example, the primary-side valves 121, the primary-side exhaust valves 132, or the secondary-side exhaust valve 152 to be described later) may also be configured with the electromagnetic valves. By configuring the secondary-side valves 141 with the electromagnetic valves, the responsiveness regarding gas supply, in particular, may be suitably improved.

In addition, each secondary-side supply pipe 140 joins at the downstream side of the corresponding secondary-side valve 141, and is then connected to the shower head 13. As a result, by opening and closing the secondary-side valve 141 to switch the supply of the gas from each flow rate controller 111, different types of gas may be mixed arbitrarily and supplied to the shower head 13 as a mixed gas.

In addition, an exhaust unit 151 is connected between the flow rate controllers 111 and the secondary-side valves 141, that is, to the secondary-side supply pipes 140 on the upstream side of the secondary-side valves 141 and on the downstream side of the flow rate controllers 111 via a secondary-side exhaust pipe 150. In an example, the exhaust unit 151 as a secondary-side exhaust mechanism is provided in common to each of the flow rate controllers 111. In addition, in the secondary-side pipe 150 as a secondary-side gas exhaust flow path, secondary-side exhaust valves 152 corresponding to respective flow rate controllers 111 are arranged. The interiors of the flow rate controllers 111 (the flow rate control units 110) and the secondary-side supply pipes 140 may be evacuated by opening/closing the secondary-side exhaust valves 152.

The exhaust unit 151 may include a vacuum pump. The vacuum pump may include a turbo molecular pump, a dry pump, or a combination thereof. In addition, the exhaust unit 151 may be used in common with the exhaust system 40 and the exhaust unit 131 (to be described later) which are connected to the plasma processing chamber 10. In addition, any type of valves such as air-operated valves or electromagnetic valves may be used as the secondary-side exhaust valves 152. From the viewpoint of improving responsiveness regarding gas exhaust, for example, the electromagnetic valves may be used.

In addition, in an embodiment, each of the secondary-side supply pipes 140 may be connected to another gas supplier 160 on the downstream side of the corresponding secondary-side valves 141. In other words, a gas supplied from the gas supplier 20 to the shower head 13 via each flow rate control unit 110 may be further mixed with another gas supplied from another gas supplier 160.

Another gas supplier 160 may include one or more gas sources 161 and flow rate controllers 162. In an embodiment, the gas supplier 160 is configured to supply at least one gas from a corresponding one of the gas sources 161 to the shower head 13 via a corresponding one of the flow rate controllers 162. Each flow rate controller 162 may include, for example, a mass flow rate controller or a pressure-controlled flow rate controller.

In an embodiment, another gas supplier 160 may be configured to be able to supply a larger flow rate of gas to the shower head 13 than the gas supplier 20. In other words, the gas supplier 20 may be configured to be able to supply a gas at a small flow rate (for example, 0.1 to 10 sccm, specifically 0.5 to 2 sccm) to the shower head 13.

In an embodiment, the operation of the gas supplier 20 is controlled by the aforementioned controller 2. Specifically, for example, the controller 2 independently controls the opening degrees of various valves (the primary-side valves 121, the primary-side exhaust valves 132, the secondary-side valves 141, and the secondary-side exhaust valves 152) provided in the gas supplier 20. As a result, the gas supplier 20 independently controls the supply of the gas from each of the plurality of flow rate control units 110 to the plasma processing chamber 10, and also independently controls the exhaust of the interior of the supply pipe in each of the plurality of flow rate control units 110.

The following is a description of the plasma processing apparatus 1 in FIG. 4.

The power supply 30 includes an RF power supply 31 coupled to the plasma processing chamber 10 via at least one impedance matching circuit. The RF power supply 31 is configured to supply at least one RF signal (RF power) such as a source RF signal and a bias RF signal to the conductive member (the lower electrode) of the substrate support 11 and/or the conductive member (the upper electrode) of the shower head 13. As a result, plasma is formed from at least one processing gas supplied to the plasma processing space 10*s*. Therefore, the RF power supply 31 may function as at least a portion of the plasma generator 12. In addition, by supplying the bias RF signal to the lower electrode, a bias potential may be generated in the substrate W, and an ionic component in the formed plasma may be drawn into the substrate W.

In an embodiment, the RF power supply 31 includes a first RF generator 31*a* and a second RF generator 31*b*. The first RF generator 31*a* is coupled to the lower electrode and/or the upper electrode via at least one impedance matching circuit to generate a source RF signal (source RF power) for plasma generation. In an embodiment, the source RF signal has a frequency in a range of 10 MHz to 150 MHz. In an embodiment, the first RF generator 31*a* may be configured to generate a plurality of source RF signals having different frequencies. The one or more generated source RF signals are supplied to the lower electrode and/or the upper electrode.

The second RF generator 31*b* is coupled to the lower electrode via at least one impedance matching circuit and is configured to generate a bias RF signal (bias RF power). The frequency of the bias RF signal may be the same as or different from the frequency of the source RF signal. In an embodiment, the bias RF signal has a frequency lower than the frequency of the source RF signal. In an embodiment, the bias RF signal has a frequency in a range of 100 kHz to 60 MHz. In an embodiment, the second RF generator 31*b* may be configured to generate a plurality of bias RF signals having different frequencies. One or more generated bias RF signals are supplied to the lower electrode. In addition, in various embodiments, at least one of the source RF signal and the bias RF signal may be pulsed.

The power supply 30 may include a DC power supply 32 coupled to the plasma processing chamber 10. The DC power supply 32 includes a first DC generator 32*a* and a second DC generator 32*b*. In an embodiment, the first DC generator 32*a* is connected to the lower electrode and is configured to generate a first DC signal. The generated first bias DC signal is applied to the lower electrode. In an embodiment, the first DC signal may be applied to another electrode such as a suction electrode in an electrostatic chuck. In an embodiment, the second DC generator 32*b* is connected to the upper electrode and configured to generate a second DC signal. The generated second DC signal is applied to the upper electrode.

In various embodiments, at least one of the first and second DC signals may be pulsed. In this case, a sequence of DC-based voltage pulses is applied to the lower electrode and/or the upper electrode. The voltage pulses may have a rectangular pulse waveform, a trapezoidal pulse waveform, a triangular pulse waveform, or a combination thereof. In an embodiment, a waveform generator configured to generate a sequence of voltage pulses from a DC signal is connected between the first DC generator 32*a* and the one lower electrode. Therefore, the first DC generator 32*a* and the waveform generator constitute a voltage pulse generator. When the second DC generator 32*b* and the waveform generator constitute the voltage pulse generator, the voltage pulse generator is connected to the upper electrode. The voltage pulses may have either a positive polarity or a negative polarity. In addition, the sequence of voltage pulses may include one or more positive voltage pulses and one or more negative voltage pulses in one cycle. Further, the first and second DC generators 32*a* and 32*b* may be provided in addition to the RF power supply 31, or the first DC generator 32*a* may be provided in place of the second RF generator 31*b*.

The exhaust system 40 may be connected to, for example, a gas discharge port 10*e* provided at the bottom of the plasma processing chamber 10. The exhaust system 40 may include a pressure regulating valve and a vacuum pump. The pressure regulating valve regulates the internal pressure of the plasma processing space 10*s*. The vacuum pump may include a turbo molecular pump, a dry pump, or a combination thereof.

Although various exemplary embodiments have been described above, the present disclosure is not limited to the exemplary embodiments described above, and various additions, omissions, substitutions, and changes may be made. In addition, elements in different embodiments may be combined to form other embodiments.

Figure 6:
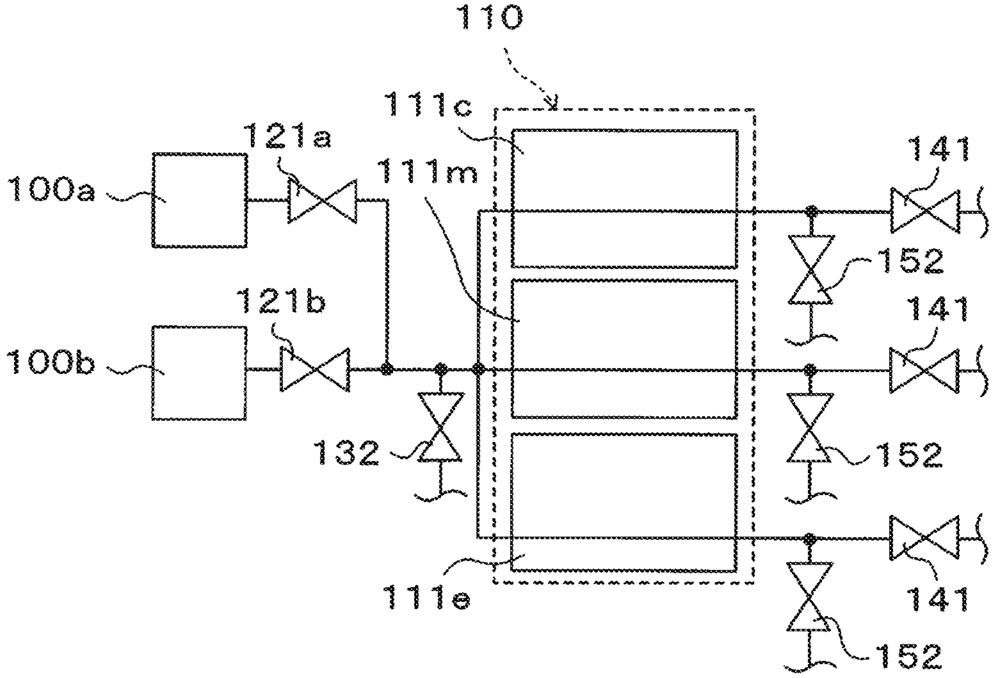
FIG. 6 is an explanatory view illustrating another configuration example of the gas supplier.

For example, in the above embodiment, the gas supplier 20 is provided with five flow rate control units 110*a* to 110*e* to correspond to five gas sources 100*a* to 100*e*, respectively. In other words, the gas supplier 20 has a single system configuration in which one type of gas is supplied to one flow rate control unit 110. However, the configuration of the gas supplier 20 is not limited thereto. As illustrated in FIG. 6, the gas supplier 20 may have a configuration of two or more systems in which multiple types of gases (two types in the example of FIG. 6) are supplied to one flow rate control unit 110.

Figure 7:
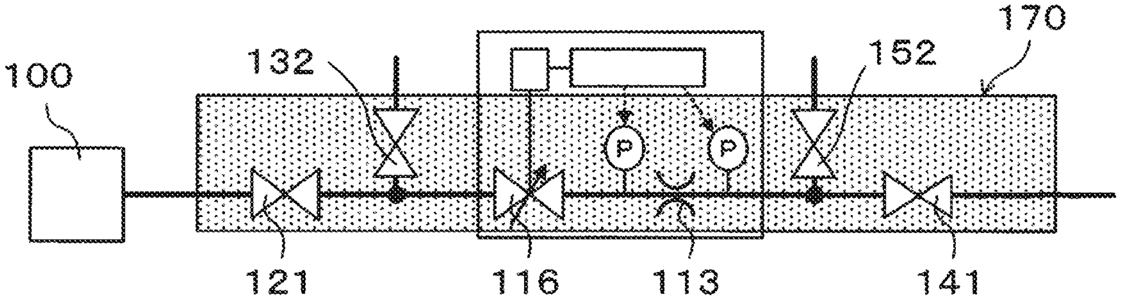
FIG. 7 is an explanatory view illustrating another configuration example of the gas supplier.

In addition, in the above embodiment, in the gas supplier 20, as illustrated in FIG. 4, various members (the primary-side valves 121, the primary-side exhaust valves 132, the orifices 113, the secondary-side exhaust valves 152, and the secondary-side valves 141) are independently connected to various supply pipes (the primary-side supply pipes 120, the internal supply pipes 112, and the secondary-side supply pipes 140). However, the configuration of the gas supplier 20 is not limited thereto. From the viewpoint of improving the maintainability of the gas supplier 20, it is desirable to integrally connect various members to various supply pipes. Specifically, as illustrated in the schematic diagram of FIG. 7 as an example, various members (the primary-side valves 121, the primary-side exhaust valves 132, the orifices 113, the secondary-side exhaust valves 152, and the secondary-side valves 141) connected to various supply pipes may be integrally configured by being fixed to an installation plate 170 as an installation member.

<Substrate Processing Method (First Embodiment)>

Next, a substrate processing method as a gas supply method (gas control method) according to a first embodiment, which is performed by using a plasma processing system configured as above, will be described. The following description will be given with reference to an example in which etching (atomic layer etching (ALE)) is executed on a substrate W to be processed in the plasma processing chamber 10, but the types of processing gases are not limited to the example below. For example, in the plasma processing chamber 10, instead of etching, arbitrary gas processes such as film formation and cleaning as described above may be performed.

In addition, in the present embodiment, a case where etching is performed on a substrate by using three types of gases, for example, a CF-based gas (for example, $C_4F_6$, $C_4F_8$, or the like) supplied from the gas source 100*a*, an oxygen ($O_2$) gas supplied from the gas source 100*b*, and an Ar gas supplied from the gas source 100*c*, will be described by way of an example. A flow rate of the CF-based gas supplied from the gas source 100*a* is controlled by the flow rate control unit 110*a*. A flow rate of the oxygen gas supplied from the gas source 100*b* is controlled by the flow rate control unit 110*b*. A flow rate of the argon gas supplied from the gas source 100*c* is controlled by the flow rate control unit 110*c*.

FIGS. 8A to 8E are explanatory views illustrating operations of the flow rate controller 111 in the main processes of wafer processing. In addition, FIG. 9 is a graph illustrating measurement values measured by the pressure sensors 114 and 115 in the main processes illustrated in FIGS. 8A to 8E, that is, the internal pressures of the primary-side internal supply pipe 112*a* and the secondary-side internal supply pipe 112*b*. Further, FIG. 10 is a timing chart of substrate processing according to an embodiment. In FIGS. 8A to 8E, three flow rate controllers 111*c*, 111*m*, and 111*e* included in the flow rate control unit 110 are illustrated as the flow rate controller 111. That is, it is assumed that the flow rate controller 111 illustrated in FIGS. 8A to 8E indicates one of the flow rate controllers 111*c*, 111*m*, and 111*e*. These flow rate controllers 111*c*, 111*m*, and 111*e* all operate in the same way.

When starting etching on the substrate W inside the plasma processing chamber 10, first, the primary-side valve 121*c* and the secondary-side valve 141*c* of the flow rate control unit 110*c* are opened to start the supply of the Ar gas to the plasma processing chamber 10 (step St0 in FIG. 10). The Ar gas acts as a carrier gas in the etching, and is constantly supplied during a series of etching processes.

The flow rates of the Ar gas supplied into the plasma processing chamber 10 via the gas supply ports 14*c*, 14*m*, and 14*e* of the shower head 13 are individually controlled by the three flow rate controllers 111*c*, 111*m*, and 111*e* of the flow rate control unit 110*c*. The Ar gas supplied into the plasma processing chamber 10 may be supplied from another gas supplier 160. In an example, the flow rate of the argon gas supplied into the plasma processing chamber 10 is larger than the flow rate of the CF-based gas supplied from the gas source 100_a_ and the flow rate of the oxygen gas supplied from the gas source 100_b_.

Figure 8A:
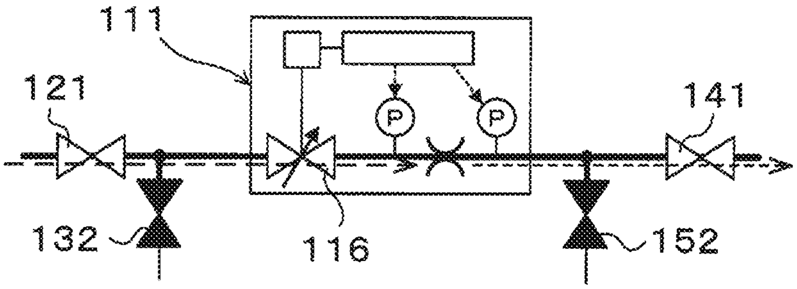
FIGS. 8A to 8E are explanatory views schematically illustrating states of an interior of a flow rate controller during substrate processing according to a first embodiment.
Figure 9:
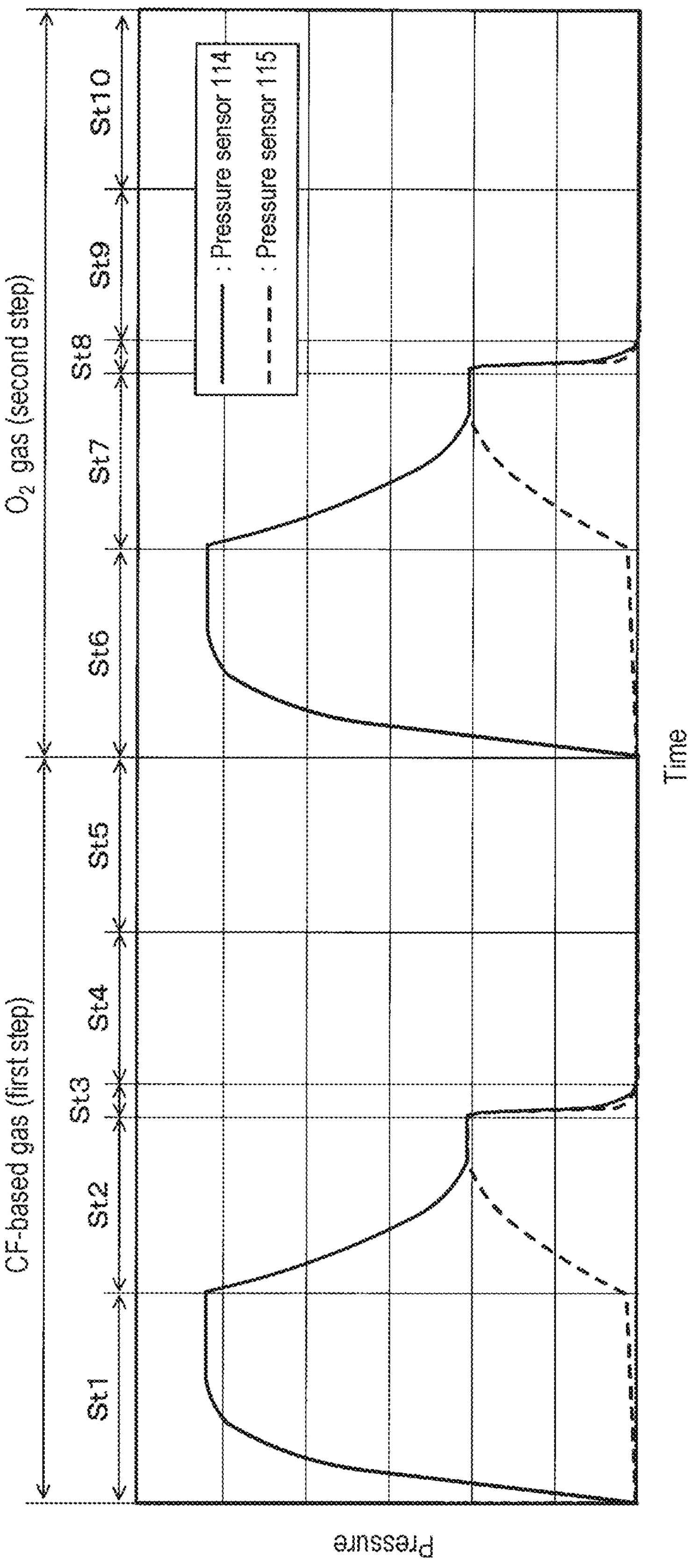
FIG. 9 is a graph illustrating an internal pressure of the flow rate controller during the substrate processing according to the first embodiment.
Figure 10:
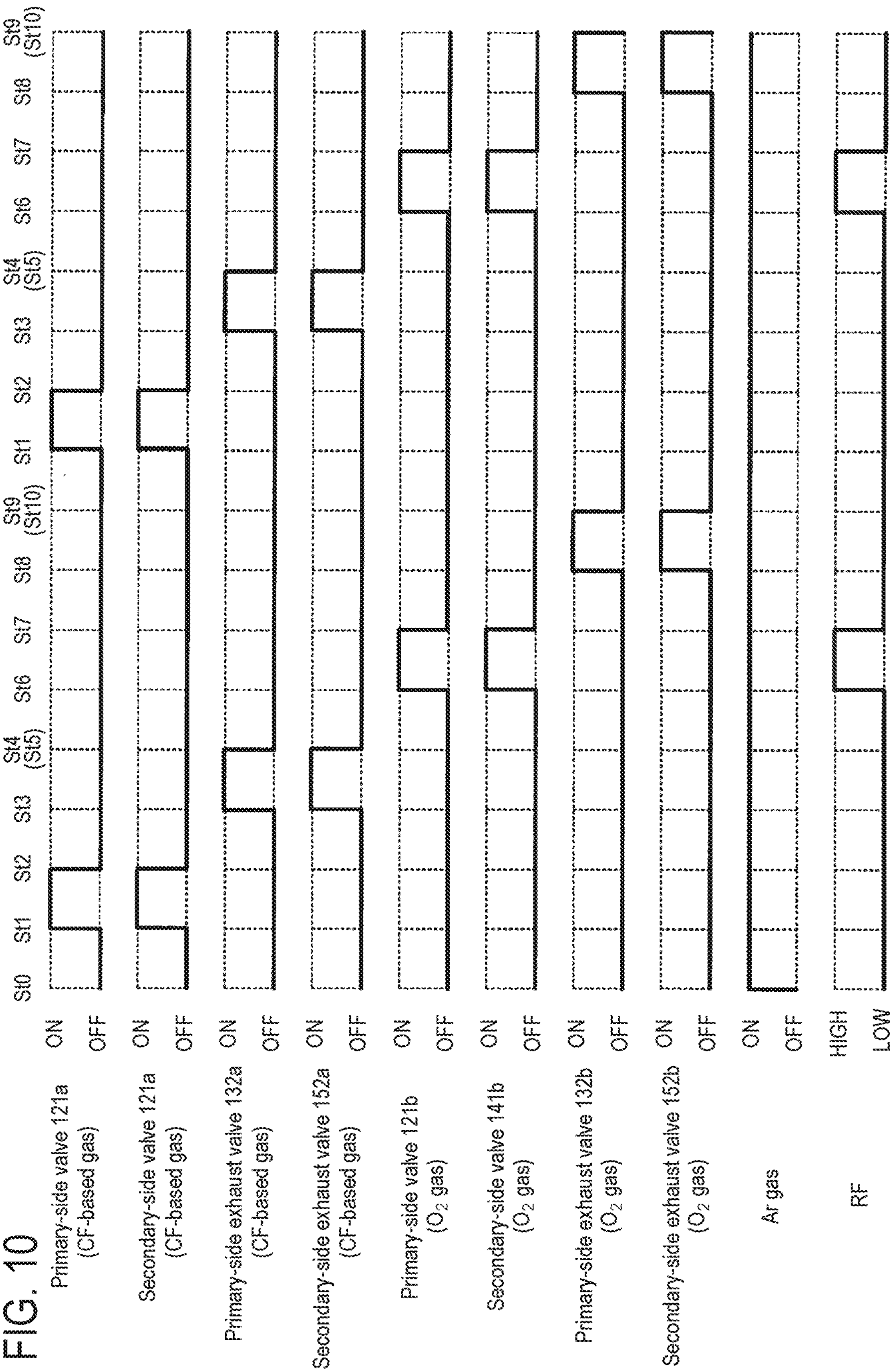
FIG. 10 is an explanatory view illustrating operation timings of various members in the substrate processing according to the first embodiment.

Next, as illustrated in FIG. 8A, the primary-side valve 121_a_ and the secondary-side valve 141_a_ of the flow rate control unit 110_a_ are opened to start the supply of the CF-based gas into the plasma processing chamber 10 (step St1 in FIGS. 9 and 10). In step St1, the gas introduced into the flow rate controller 111 from the gas source 100_a_ is supplied to the plasma processing chamber 10 after the flow rate of which is reduced by the orifice 113. In other words, the internal pressure of the secondary-side internal supply pipe 112_b_ is lower than the internal pressure of the primary-side internal supply pipe 112_a_. In step St1, a CF-based deposit is formed on the substrate W by the CF-based gas supplied into the plasma processing chamber 10 (hereinafter, sometimes referred to as a "deposition operation").

In addition, the flow rates of the CF-based gas supplied into the plasma processing chamber 10 via the gas supply ports 14_c,_ 14_m,_ and 14_e_ of the shower head 13 are individually controlled by the three flow rate controllers 111_c,_ 111_m,_ and 111_e_ of the flow rate control unit 110_a_. In other words, by individually controlling the flow rates of the CF-based gas to be supplied to the center region, the middle region, and the edge region of the substrate W, the amount of the CF-based deposit formed in each of the center region, the middle region, and the edge region is controlled.

Figure 8B:
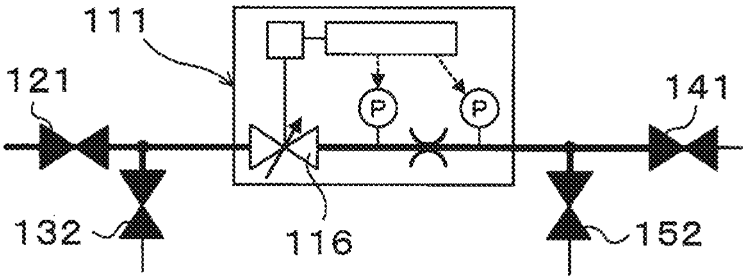

Once the CF-based deposit is formed on the substrate W, subsequently, as illustrated in FIG. 8B, the primary-side valve 121_a_ and the secondary-side valve 141_a_ of the flow rate control unit 110_a_ are closed to stop the supply of the CF-based gas into the plasma processing chamber 10 (step St2 in FIGS. 9 and 10). In step St2, by closing the primary-side valve 121_a_ and the secondary-side valve 141_a,_ the interiors of the flow rate controller 111, the primary-side supply pipe 120, and the secondary-side supply pipe 140 are separated from the outside. As a result, the gas in the primary-side supply pipe 120 moves into the secondary-side supply pipe 140 via the orifice, and the internal pressures of the primary-side supply pipe 120 and the secondary-side supply pipe 140 are approximately equal to each other, resulting in an equilibrium state.

Figure 8C:
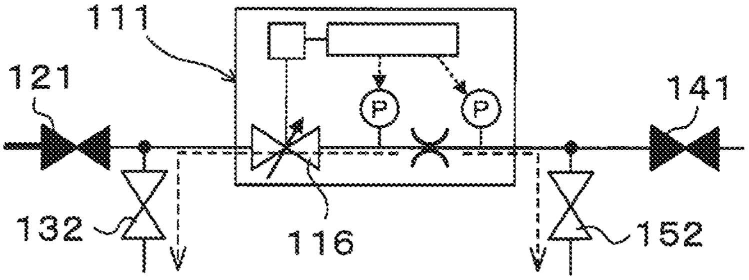

Subsequently, as illustrated in FIG. 8C, the primary-side exhaust valve 132_a_ and the secondary-side exhaust valve 152_a_ of the flow rate control unit 110_a_ are opened to exhaust the interior of the flow rate control unit 110_a_ (the flow rate controller 111) that has supplied the CF-based (step St3 in FIGS. 9 and 10: hereinafter sometimes referred to as "first exhaust operation").

More specifically, by opening the primary-side exhaust valve 132_a,_ the exhaust unit 131 exhausts the interiors of the primary-side supply pipe 120 and the primary-side internal supply pipe 112_a,_ and by opening the secondary-side exhaust valve 152_a,_ the exhaust unit 151 exhausts the interiors of the secondary-side supply pipe 140 and the secondary-side internal supply pipe 112_b_. In addition, in order to appropriately suppress the occurrence of a spike S illustrated in FIG. 1, it is desirable to conduct the exhaust of the flow rate control unit 110_a_ (the flow rate controller 111) by the exhaust unit 151 until the internal pressure of the flow rate control unit 110_a_ becomes lower than the internal pressure during the flow rate control (during the deposition operation), specifically until the gas within the flow rate control unit 110_a_ is completely exhausted.

In the present embodiment, the interior of the flow rate controller 111 is exhausted by using the exhaust unit 131 and the exhaust unit 151 which are connected to the upstream and downstream sides of the flow rate controller 111, respectively. As a result, even when the flow rate controller 111 includes the orifice 113, the time required to exhaust the primary-side internal supply pipe 112_a_ on the upstream side of the orifice 113 and the secondary-side internal supply pipe 112_b_ on the downstream side may be appropriately shortened. Further, it is possible to appropriately suppress the gas from remaining in the primary-side internal supply pipe 112_a_ and the secondary-side internal supply pipe 112_b_.

Figure 8D:
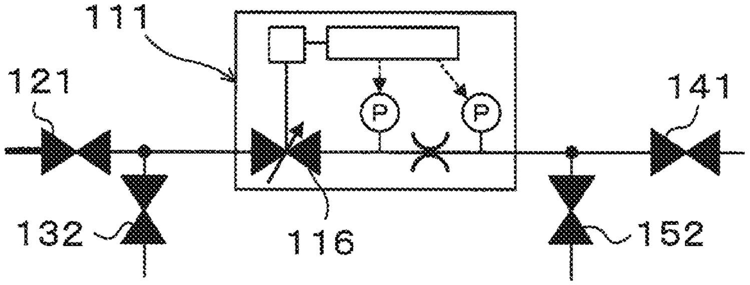

Subsequently, as illustrated in FIG. 8D, the control valve 116, the primary-side exhaust valve 132_a,_ and the secondary-side exhaust valve 152_a_ of the flow rate control unit 110_a_ are closed to stop the exhaust from the flow rate control unit 110_a_ (step St4 of FIGS. 9 and 10). In step St4, by closing the primary-side valve 121_a_ and the secondary-side valve 141_a,_ the interiors of the flow rate controller 111, the primary-side supply pipe 120, and the secondary-side supply pipe 140 are separated from the outside. As a result, the gas in the primary-side supply pipe 120 moves into the secondary-side supply pipe 140 via the orifice, and the internal pressures of the primary-side supply pipe 120 and the secondary-side supply pipe 140 are approximately equal to each other, resulting in an equilibrium state.

Figure 8E:
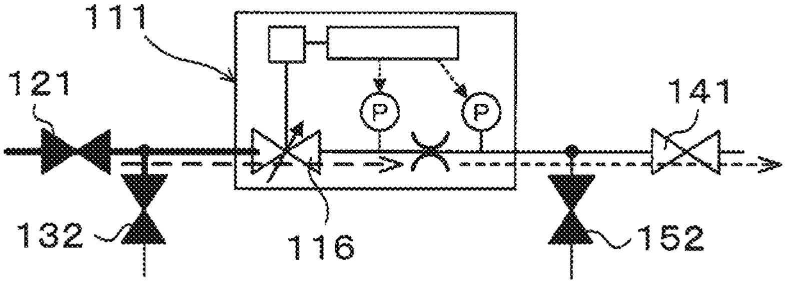

In addition, after the first exhaust operation (step St4) is completed, as illustrated in FIG. 8E, by opening the control valve 116 of the flow rate controller 111_a_ and the secondary-side valve 141_a_ of the flow rate control unit 110_a,_ it may be checked whether the residual gas in the flow rate controller 111_a_ has been properly exhausted (step St5 in FIGS. 9 and 10).

In the following description, steps St1 to St5, in other words, the above-mentioned deposition operation and first exhaust operation may be collectively referred to as a "deposition process (first process)".

Subsequently, the primary-side valve 121_b_ and the secondary-side valve 141_b_ of the flow rate control unit 110_b_ are opened to start the supply of the $O_2$ gas into the plasma processing chamber 10 (see FIG. 8A). At the same time, the supply of an RF signal (RF power) from the RF power supply 31 to the conductive member of the substrate support 11 (the lower electrode) and/or the conductive member of the shower head 13 (the upper electrode) also starts (step St6 in FIGS. 9 and 10). In step St6, the gas introduced into the flow rate controller 111 from the gas source 100_b_ is supplied to the plasma processing chamber 10 after the flow rate of which is reduced by the orifice 113. In other words, the internal pressure of the secondary-side internal supply pipe 112_b_ is lower than the internal pressure of the primary-side internal supply pipe 112_a_. In step St6, plasma derived from the $O_2$ gas supplied into the plasma processing chamber 10 is generated to etch the substrate W (hereinafter, sometimes referred to as an "etching operation").

The flow rates of the $O_2$ gas supplied into the plasma processing chamber 10 via the gas supply ports 14_c,_ 14_m,_ and 14_e_ of the shower head 13 are individually controlled by the three flow rate controllers 111_c,_ 111_m,_ and 111_e_ of the flow rate control unit 110_b_. In other words, by individually controlling the flow rates of the $O_2$ gas to the center region, the middle region, and the edge region of the substrate W, etching amounts of the substrate W in the center region, the middle region, and the edge region are individually controlled.

After the etching of the substrate W is completed, the primary-side valve 121_b_ and the secondary-side valve 141_b_ of the flow rate control unit 110_b_ are closed, and the supply of the $O_2$ gas into the plasma processing chamber 10 is stopped (step St7 of FIGS. 9 and 10: see FIG. 8B). In step St7, by closing the primary-side valve 121*b* and the secondary-side valve 141*b*, the interiors of the flow rate controller 111, the primary-side supply pipe 120, and the secondary-side supply pipe 140 are separated from the outside. As a result, the gas in the primary-side supply pipe 120 moves into the secondary-side supply pipe 140 via the orifice, and the internal pressures of the primary-side supply pipe 120 and the secondary-side supply pipe 140 are approximately equal to each other, resulting in an equilibrium state.

Subsequently, the primary-side exhaust valve 132*b* and the secondary-side exhaust valve 152*b* of the flow rate control unit 110*b* are opened (see FIG. 8C) to exhaust the interior of the flow rate control unit 110*b* (the flow rate controller 111) that has executed the supply of the $O_2$ gas (step St8 in FIGS. 9 and 10: hereinafter, sometimes referred to as a "second exhaust operation"). More specifically, by opening the primary-side exhaust valve 132*b*, the exhaust unit 131 exhausts the interiors of the primary-side supply pipe 120 and the primary-side internal supply pipe 112*a*, and by opening the secondary-side exhaust valve 152*a*, the exhaust unit 151 exhausts the interiors of the secondary-side supply pipe 140 and the secondary-side internal supply pipe 112*b*. In addition, a detailed exhaust method by the flow rate control unit 110*b* is similar to the exhaust method by the flow rate control unit 110*a* in step St3. In addition, in order to appropriately suppress the occurrence of the spike S illustrated in FIG. 1, it is desirable to execute the exhaust from the flow rate control unit 110*b* (the flow rate controller 111) by the exhaust unit 151 until the internal pressure of the flow rate control unit 110*b* becomes lower than the internal pressure during the flow rate control (during the etching operation), specifically until the gas within the flow rate control unit 110*b* is completely exhausted.

Subsequently, the control valve 116, the primary-side exhaust valve 132*b*, and the secondary-side exhaust valve 152*b* of the flow rate control unit 110*b* are closed to stop the exhaust from the flow rate control unit 110*b* (step St9 of FIGS. 9 and 10: see FIG. 8D). In step St9, by closing the primary-side valve 121*b* and the secondary-side valve 141*b*, the interiors of the flow rate controller 111, the primary-side supply pipe 120, and the secondary-side supply pipe 140 are separated from the outside. As a result, the gas in the primary-side supply pipe 120 moves into the secondary-side supply pipe 140 via the orifice, and the internal pressures of the primary-side supply pipe 120 and the secondary-side supply pipe 140 are approximately equal to each other, resulting in an equilibrium state.

In addition, after the second exhaust operation (step St9) is completed, it may be checked whether the residual gas in the flow rate controller 111*a* has been properly exhausted (step St10 in FIGS. 9 and 10) by opening the control valve 116 of the flow rate controller 111*a* and the secondary-side valve 141*a* of the flow rate control unit 110*a* (see FIG. 8E).

In the following description, steps St6 to St10, in other words, the above-mentioned etching operation and second exhaust operation, may be collectively referred to as an "etching process (second process)."

In the present embodiment, as illustrated in FIG. 10, the process cycle including the first process as the deposition process (steps St1 to St5) and the second process as the etching process (steps St6 to St10) is repeated until a desired amount of etching is obtained on the substrate W.

In an example, the time required for one cycle is, for example, 1 to 10 seconds, specifically 0.5 seconds to 3 seconds for the deposition process and 0.5 seconds to 7 seconds for the etching process, and more specifically, 1 to 2 seconds for the deposition process and 3 to 5 seconds for the etching process.

Thereafter, after one or more cycles are repeated a desired number of times, it is determined whether additional etching cycles (the deposition process (first process) and the etching process (second process)) are necessary. When it is determined to be necessary, the process returns to step St1 and the first process and the second process are repeated, as illustrated in FIG. 10. In addition, when it is determined that no additional etching cycle is necessary, the etching for the substrate W is terminated.

When it is determined that an additional process of the etching is necessary, as illustrated in FIG. 10, a CF-based gas and an $O_2$ gas are supplied from the flow rate control unit 110*a* and the flow rate control unit 110*b* to the plasma processing chamber 10 again. At this time, it is necessary to start the supply of the gas from the gas sources 100*a* and 100*b* again. When the supply of the gas starts from a state in which the interior of the flow rate control unit 110 is evacuated as illustrated in FIG. 8D, it is necessary to fill the flow rate control unit 110 with the gases before starting the supply of the gas into the plasma processing chamber 10, which requires time to restart the process.

Figure 11A:
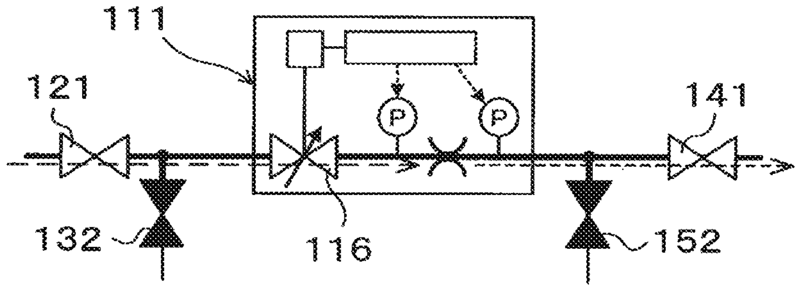
FIGS. 11A to 11E are explanatory views schematically illustrating states of an interior of a flow rate controller during substrate processing according to another embodiment.
Figure 11B:
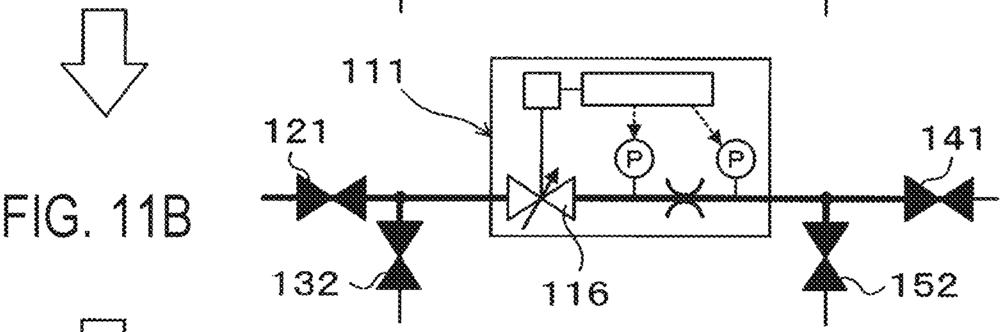
Figure 11C:
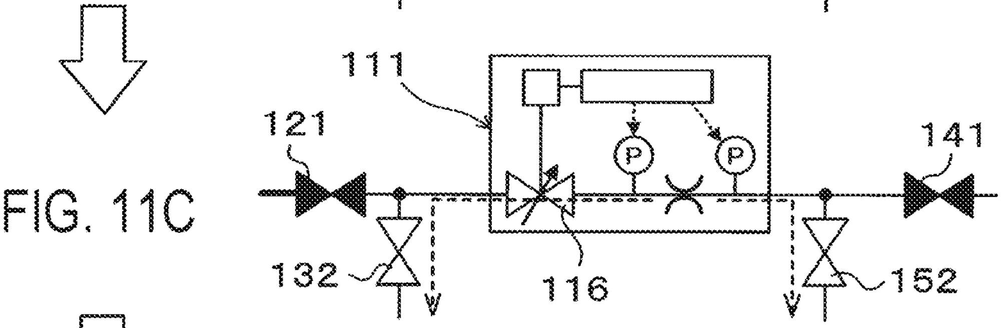
Figure 11D:
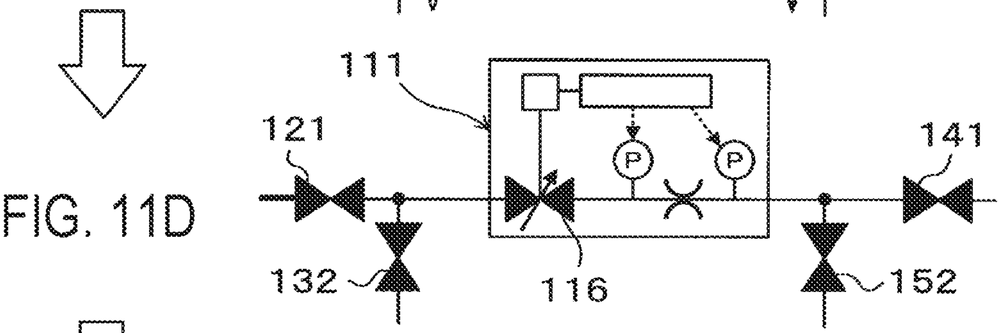
Figure 11E:
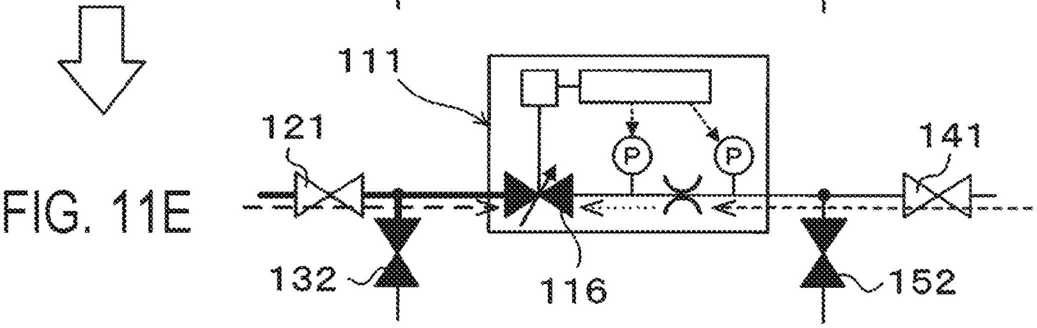

Therefore, in the plasma processing according to the present embodiment, when the process cycle of the etching is repeated in this way, especially when the gas supplier 20 has a configuration of one system that supplies one type of gas to one flow rate control unit 110, a pre-control preparation may be performed prior to starting the supply of the gas into the plasma processing chamber 10 again. Specifically, as illustrated in FIG. 11E, by opening the primary-side valve 121 of the flow rate control unit 110, the gas is filled in the primary-side supply pipe 120, and by opening the secondary-side valve 141, the internal pressures of the internal supply pipe 112 and the secondary-side supply pipe 140 are balanced with the internal pressure of the plasma processing chamber 10. This makes it possible to shorten the time required to fill the gas from the gas source 100 when the process starts again, and suppress the sudden flow of gas into the plasma processing chamber 10, thus appropriately suppressing the occurrence of the spike S illustrated in FIG. 1.

The operations illustrated in FIGS. 11A to 11D are the same as the operations illustrated in FIGS. 8A to 8D. In this case, the operation of identifying whether the residual gas in the flow rate controller 111*a* has been appropriately exhausted (step St5, step St10), which corresponds to FIG. 8E, may be omitted as illustrated in FIGS. 11A to 11E. Alternatively, although not illustrated, the opening of the primary-side valve 121 and the secondary-side valve 141 illustrated in FIG. 11E may be performed after the identifying operation (step St5, step St10).

<Effects or the like of Substrate Processing according to First Embodiment>

Figure 12:
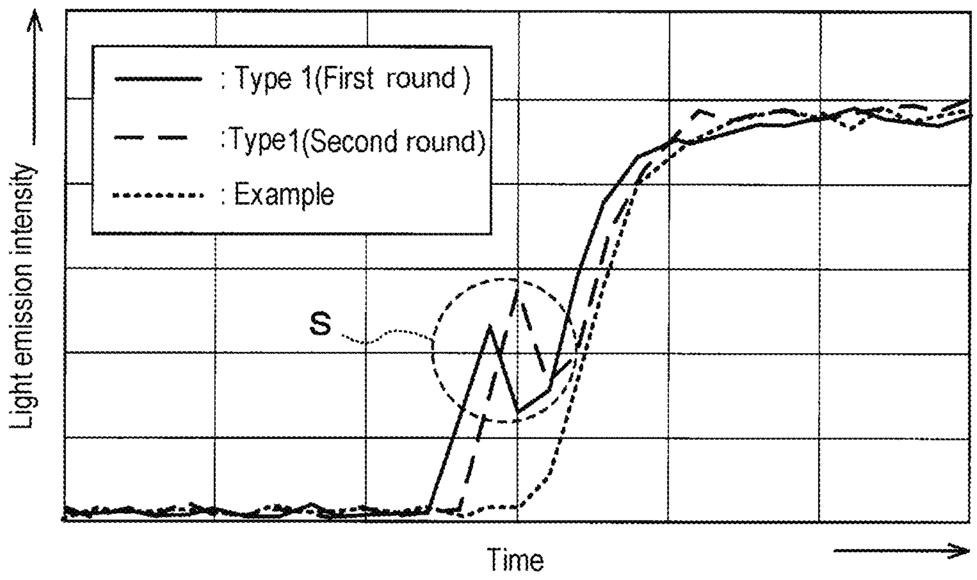
FIG. 12 is a graph illustrating states inside a chamber at the start of processing according to the first embodiment.

FIG. 12 is a graph illustrating comparison results for examining the effects of the plasma processing apparatus 1 according to the above embodiment, in which the results of comparison with the case where the exhaust was performed by using only the exhaust unit 131 connected to the upstream side of the orifice 113 (Type 1 illustrated in FIG. 1) are illustrated. In both Comparative Example (Type 1) and Example illustrated in FIG. 12, the flow rate controller 111 was evacuated for a short period of time (for example, about 1 sec).

As illustrated in FIG. 12, after the exhaust was performed by using only the exhaust unit 131 connected to the upstream side of the orifice 113, when the secondary-side valve 141 is opened, the spike S may occur due to the gas remaining in the secondary-side internal supply pipe 112*b*. The occurrence of the spike S becomes particularly high when the evacuation time of the flow rate controller 111 is short. In this regard, in the present embodiment, it has been found that by further performing the exhaust by using the exhaust unit 151 connected to the downstream side of the orifice 113, the occurrence of the spike S may be suppressed even when the evacuation time of the flow rate controller 111 is short (about 1 sec in the present example).

Figure 13:
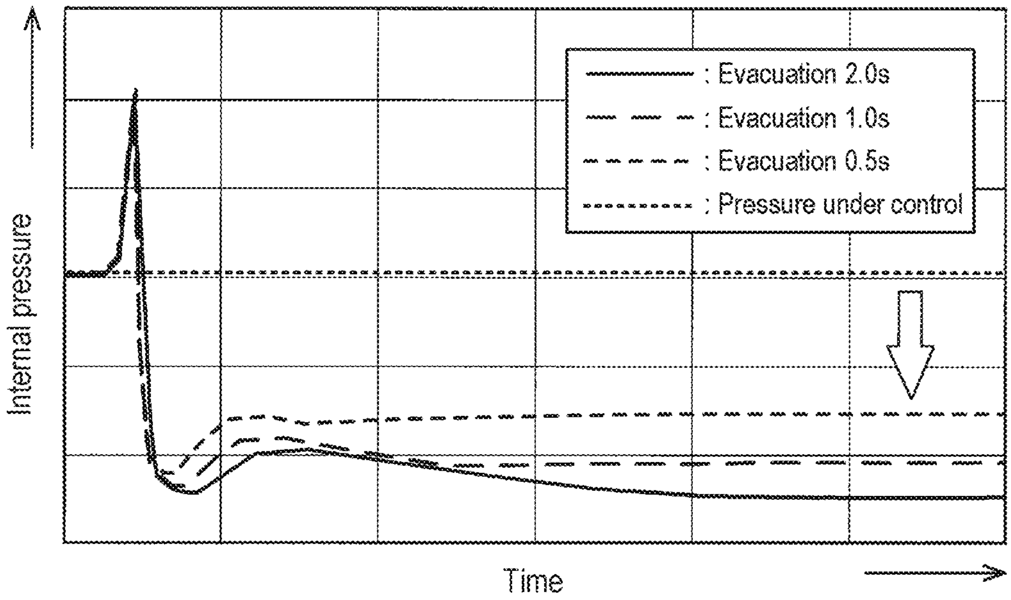
FIG. 13 is a graph illustrating a relationship between an evacuation time and the internal pressure in the flow rate controller.

FIG. 13 is a graph illustrating a relationship between the evacuation time and the internal pressure of the flow rate controller 111 in the first exhaust operation (step St3) and the second exhaust operation (step St9) described above. Here, in order to appropriately suppress the occurrence of the spike S when starting the process again, it is necessary to lower the internal pressure of the flow rate controller 111 during evacuation compared to the pressure during flow rate control (during process). In this regard, as illustrated in FIG. 13, it was found that by providing an exhaust line between the orifice 113 of the flow rate controller 111 and the secondary-side valve 141 as described above, the evacuation time may be reduced to 2 seconds or less, and the internal pressure of the flow rate controller 111 may be reduced to a pressure lower than the pressure during the flow rate control even when the evacuation time is set to 2 seconds or less, more specifically, 0.5 seconds. That is, the present inventors found that the time required for evacuation in the first exhaust operation (step St3) and the second exhaust operation (step St9) described above may be shortened to 0.5 seconds or less.

As described above, according to the plasma processing apparatus 1 of the present embodiment, in the gas supplier 20 that supplies gas into the plasma processing chamber 10, an exhaust line (the secondary-side exhaust pipe 150, the exhaust unit 151, and the secondary-side exhaust valve 152) is provided between the orifice 113 of the flow rate controller 111 and the secondary-side valve 141. Thus, by evacuating the interior of the flow rate controller 111 in a short period of time between processes in the plasma processing (between the deposition operation and the etching operation according to the above embodiment), it is possible to appropriately suppress the occurrence of the spike S when the process starts again.

In addition, according to the above embodiment, as illustrated in FIG. 11E, prior to starting the supply of the gas into the plasma processing chamber 10 again, as a pre-control preparation, the interior of the primary-side supply pipe 120 is filled with the gas, and the internal pressures of the internal supply pipe 112, the secondary-side supply pipe 140, and the plasma processing chamber 10 are balanced. This makes it possible to appropriately shorten the time required to fill the flow rate controller 111 with the gas when starting the process again, and further appropriately suppress the occurrence of the spike S when starting the process again.

In the above embodiment, when the flow rate control unit 110 (the flow rate controller 111) is evacuated, the evacuation of the flow rate control unit 110 (the flow rate controller 111) was performed until the pressure in the flow rate control unit 110*b* became lower than the internal pressure during flow rate control (during the deposition operation or the etching operation), specifically until the gas inside the flow rate control unit 110*b* was completely exhausted. However, the ultimate pressure after the evacuation of the flow rate control unit 110 (the flow rate controller 111) is not limited to this.

Specifically, as described above, in the case where the gas supplier 20 has a configuration of one system that supplies one type of gas to one flow rate control unit 110, the occurrence of mixing of multiple types of gases inside the flow rate control unit 110 is suppressed. Therefore, when the flow rate control unit 110 (the flow rate controller 111) is configured in one system, the gas inside the flow rate control unit 110 may not be completely exhausted, but a portion of the gas may remain during the evacuation.

As described above, the occurrence of the spike S at the time of starting the process again may be appropriately suppressed by setting the internal pressure of the flow rate control unit 110 to be lower than the internal pressure at the time of the flow rate control. On the other hand, especially in the etching process of the substrate W, it is important to shorten the plasma startup time inside the plasma processing chamber (to increase the slope of the graph illustrated in FIG. 1). The present inventors have found that the plasma startup time may be shortened by causing the gas remaining in the flow rate control unit 110 (the flow rate controller 111) to flow into the plasma processing chamber 10 when starting the process again. In other words, the present inventors have found that in the evacuation of the flow rate control unit 110 (the flow rate controller 111), by suppressing the occurrence of the spike S when starting the process again and performing the evacuation up to a pressure that may shorten the plasma startup time, the etching on the substrate W may be performed more suitably.

The present inventors have conducted extensive studies and found that by setting the internal pressure of the flow rate control unit 110 (the flow rate controller 111) after the evacuation to, for example, 100 Torr or less, specifically 50 Torr or less, the occurrence of the spike S at the time of starting the process again may be suppressed, and the plasma startup time may be suitably shortened.

Further, in view of the fact that the interior of the flow rate controller 111 may be appropriately exhausted even when the evacuation time is shortened in this way, the technology of the present disclosure can be suitably applied especially when the gas supplier 20 has a configuration of two or more systems (see FIG. 6).

Specifically, in a case where the gas supplier 20 has a configuration of two or more systems, that is, when two or more types of gases are supplied to one flow rate controller 111, it is necessary to suppress mixing of different types of gases inside the flow rate controller 111. In other words, before switching the supply of one gas to the flow rate controller 111 to the supply of another gas, it is necessary to sufficiently exhaust the first gas as the residual gas from the interior of the flow rate controller 111.

Figure 14:
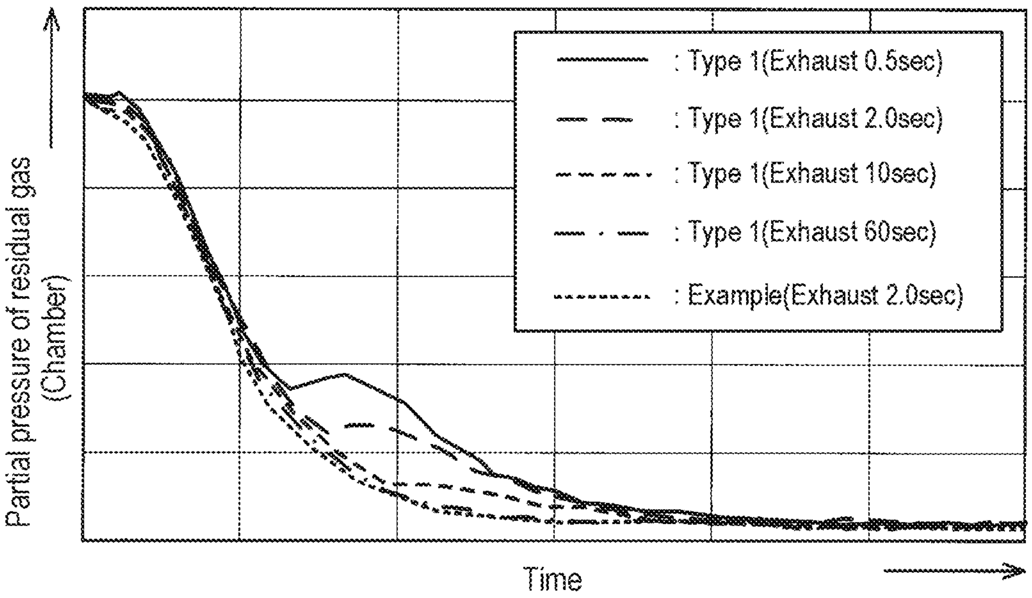
FIG. 14 is a graph illustrating a relationship between the evacuation time in the flow rate controller and an internal pressure of a plasma processing chamber.

In this regard, the present inventors have found that with the exhaust method in the related art (for example, Type 1 illustrated in FIG. 1), in order to exhaust the residual gas from the flow rate controller 111 to the extent that the influence of the residual gas in the plasma processing chamber 10 may be suppressed, evacuation for about 60 seconds was required as illustrated in FIG. 14. However, according to the present embodiment, the influence of residual gas may be sufficiently suppressed even when evacuation is performed for about 2 seconds. That is, the present inventors have found that in order to suppress the mixing of the first gas and another gas inside the flow rate controller 111, in the related art, it was necessary to exhaust one gas for about 60 seconds, but by further performing the evacuation on the downstream side of the orifice 113, the exhaust time for one gas may be shortened to about 2 seconds. In other words, the present inventors have found that the fall responsiveness of the flow rate controller 111 related to the evacuation may be improved.

In this way, according to the present embodiment, especially when the gas supplier 20 has a configuration of two or more systems, it becomes possible to instantly switch the supply of the gas from different gas sources 100 to one flow rate controller 111.

In addition, the operation of the flow rate controller 111 during the substrate processing is not limited to the embodiments illustrated in FIGS. 8 and 11A to 11E FIGS. 15A to 15F are explanatory views illustrating operations of the flow rate controller 111 in the main operations of substrate processing according to another embodiment. In FIGS. 15A to 15F, as in FIGS. 8 and 11A to 11E, three flow rate controllers 111*c*, 111*m*, and 111*e* included in the flow rate control unit 110 are illustrated as a flow rate controller 111. That is, it is assumed that the flow rate controller 111 illustrated in FIGS. 15A to 15F includes the flow rate controllers 111*c*, 111*m*, and 111*e*.

First, the primary-side valve 121*c* and the secondary-side valve 141*c* of the flow rate control unit 110*c* are opened to start the supply of the Ar gas to the plasma processing chamber 10. The Ar gas acts as a carrier gas in the etching, and is constantly supplied during a series of etching processes.

Figures 15A, 15B, 15C, 15D, 15E, 15F:
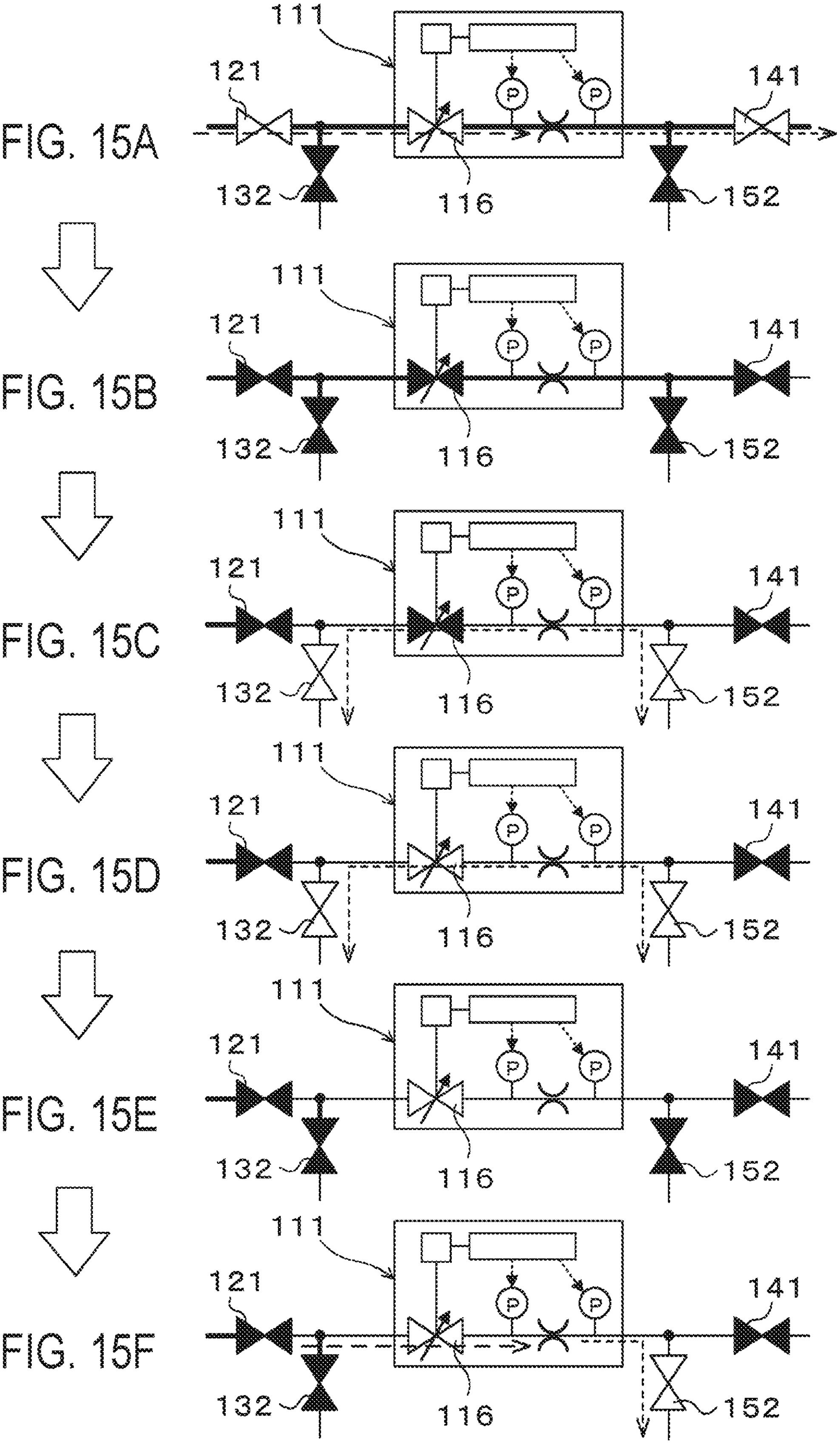
FIGS. 15A to 15F are explanatory views schematically illustrating states of an interior of a flow rate controller during substrate processing according to another embodiment.

Subsequently, as illustrated in FIG. 15A, the primary-side valve 121*a* and the secondary-side valve 141*a* of the flow rate control unit 110*a* are opened to start the supply of the CF-based gas into the plasma processing chamber 10. That is, the above-described deposition operation starts, and the CF-based deposit is formed on the substrate W.

Subsequently, as illustrated in FIG. 15B, the primary-side valve 121*a*, the control valve 116, and the secondary-side valve 141*a* of the flow rate control unit 110*a* are closed to stop the supply of the CF-based gas into the plasma processing chamber 10.

Subsequently, as illustrated in FIG. 15C, the primary-side exhaust valve 132*a* is opened after a predetermined delay in consideration of the responsiveness of the primary-side exhaust valve 132*a* of the flow rate control unit 110*a*. At this time, the secondary-side exhaust valve 152*a* is also opened. Then, the interior of the flow rate control unit 110*a* (the flow rate controller 111) that has supplied the CF-based gas is exhausted (in the first exhaust operation).

Subsequently, as illustrated in FIG. 15D, the control valve 116 is opened after a predetermined delay in consideration of the responsiveness of the control valve 116 of the flow rate control unit 110*a*. Then, the residual gases in the primary-side internal supply pipe 112*a* and the secondary-side internal supply pipe 112*b* are exhausted.

Subsequently, as illustrated in FIG. 15E, the primary-side exhaust valve 132*a* and the secondary-side exhaust valve 152*a* of the flow rate control unit 110*a* are closed to stop the exhaust of the flow rate control unit 110*a*.

After the first exhaust operation is completed, it may be checked whether the residual gas in the flow rate controller 111*a* has been appropriately exhausted by opening the control valve 116 of the flow rate controller 111*a* and the secondary-side exhaust valve 152*a* as illustrated in FIG. 15F. At this time, the secondary-side exhaust valve 152*a* is opened after a predetermined delay in consideration of the responsiveness of the secondary-side exhaust valve 152*a*.

The deposition process is performed as described above. In the subsequent etching process, although the types of gases used are different, the operations of the flow rate controller 111 are the same as those illustrated in FIGS. 15A to 15F, and thus a description thereof will be omitted.

In the present embodiment as well, it is possible to provide the same effects as in the above embodiments. That is, it is possible to suppress the occurrence of the spike S when starting the process again and to shorten the plasma startup time.

In the above-described embodiment, the interior of the flow rate control unit 110 may be evacuated from both the upstream and downstream sides of the flow rate control unit 110, as illustrated in FIGS. 4 to 7. In this regard, in the present embodiment (the first embodiment), the interior of the flow rate control unit 110 may be evacuated only from the upstream side of the flow rate control unit 110. That is, especially according to the present embodiment (the first embodiment), as illustrated in FIG. 16, the flow rate control unit 110 according to the technology of the present disclosure may include only the primary-side exhaust pipe 130, the exhaust unit 131, and the primary-side exhaust valve 132, and may not include the secondary-side exhaust pipe 150, the exhaust unit 151, and the secondary-side exhaust valve 152.

Figure 16:
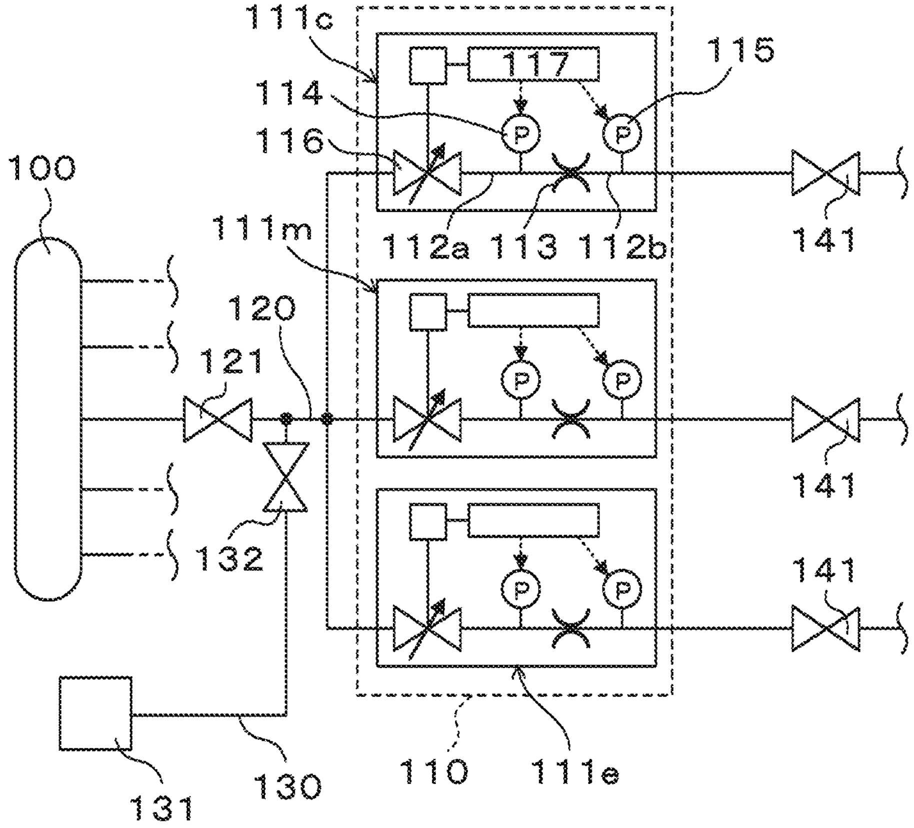
FIG. 16 is an explanatory view illustrating another configuration example of a gas supplier.

FIGS. 17A to 17E are explanatory views illustrating operations of the flow rate controller 111 illustrated in FIG. 16. In FIGS. 17A to 17E, as in FIGS. 8A to 8E, 11A to 11E, and 15A to 15F, three flow rate controllers 111*c*, 111*m*, and 111*e* included in the flow rate control unit 110 are illustrated as a flow rate controller 111. That is, it is assumed that the flow rate controller 111 illustrated in FIGS. 17A to 17E includes the flow rate controllers 111*c*, 111*m*, and 111*e*.

First, the primary-side valve 121*c* and the secondary-side valve 141*c* of the flow rate control unit 110*c* are opened to start the supply of the Ar gas into the plasma processing chamber 10. The Ar gas acts as a carrier gas in the etching, and is constantly supplied during a series of etching operations.

Figure 17A:
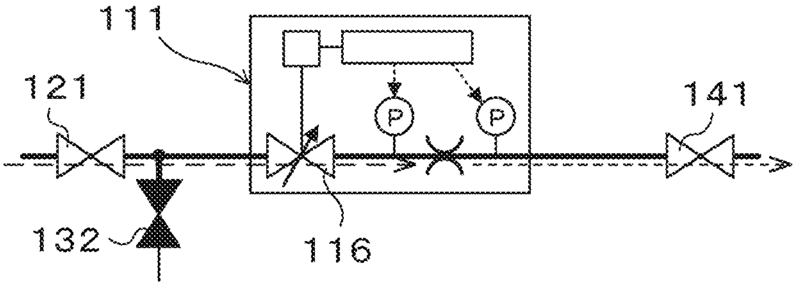
FIGS. 17A to 17E are explanatory views schematically illustrating states of an interior of a flow rate controller during substrate processing according to another embodiment.

Subsequently, as illustrated in FIG. 17A, the primary-side valve 121*a* and the secondary-side valve 141*a* of the flow rate control unit 110*a* are opened to start the supply of the CF-based gas into the plasma processing chamber 10. That is, the above-described deposition operation starts to form the CF-based deposit on the substrate W.

Figure 17B:
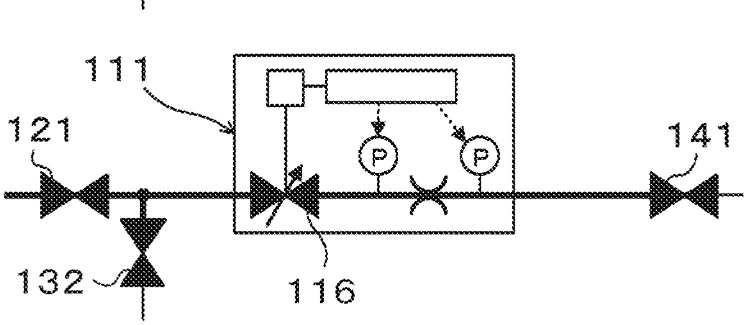

Subsequently, as illustrated in FIG. 17B, the primary-side valve 121*a*, the control valve 116, and the secondary-side valve 141*a* of the flow rate control unit 110*a* are closed to stop the supply of the CF-based gas into the plasma processing chamber 10.

Figure 17C:
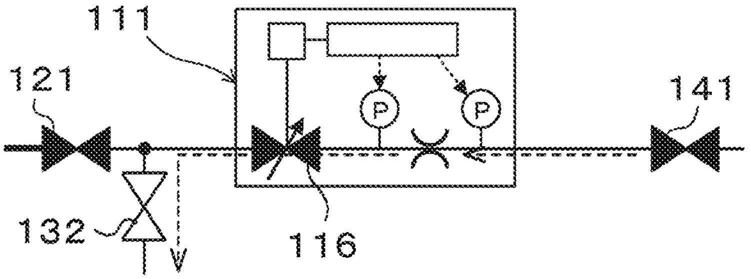

Subsequently, as illustrated in FIG. 17C, the primary-side exhaust valve 132*a* is opened after a predetermined delay in consideration of the responsiveness of the primary-side exhaust valve 132*a* of the flow rate control unit 110*a*. Then, the interior of the flow rate control unit 110*a* (the flow rate controller 111) that has supplied the CF-based gas is exhausted.

Figure 17D:
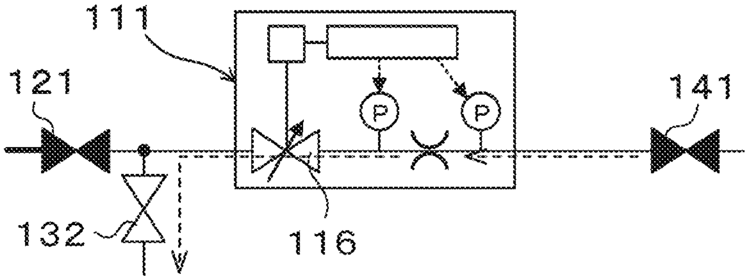

Subsequently, as illustrated in FIG. 17D, the control valve 116 is opened after a predetermined delay in consideration of the responsiveness of the control valve 116 of the flow rate control unit 110*a*. Then, the residual gases in the primary-side internal supply pipe 112*a* and the secondary-side internal supply pipe 112*b* are exhausted.

Figure 17E:
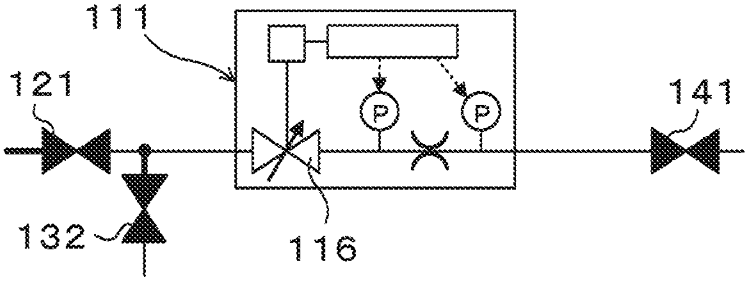

Subsequently, as illustrated FIG. 17E, the primary-side exhaust valve 132*a* of the flow rate control unit 110*a* is closed to stop the exhaust of the flow rate control unit 110*a*.

The deposition process is performed as described above. In the subsequent etching operation, although the types of gases used are different, the operations of the flow rate controller 111 are the same as those illustrated in FIGS. 17A to 17E, and thus a description thereof will be omitted.

In the present embodiment as well, it is possible to provide the same effects as in the above embodiments. That is, it is possible to suppress the occurrence of the spike S when starting the process again and to shorten the plasma startup time.

In the above-described embodiment, as illustrated in FIGS. 4 to 7, the flow rate control unit 110 is configured to be evacuated from both the upstream and downstream sides of the flow rate control unit 110. Alternatively, as illustrated in FIG. 16, the flow rate control unit 110 is configured to be evacuated only from the upstream side of the flow rate control unit 110. In this regard, in the present embodiment (the first embodiment), the interior of the flow rate control unit 110 may be evacuated only from the downstream side of the flow rate control unit 110. In other words, especially according to the present embodiment (the first embodiment), the flow rate control unit 110 according to the technology of the present disclosure may include only the secondary-side exhaust pipe 150, the exhaust unit 151, and the secondary-side exhaust valve 152, but may not include the primary-side exhaust pipe 130, the exhaust unit 131, and the primary-side exhaust valve 132. In this case as well, the above-mentioned effects may be provided.

Figure 18:
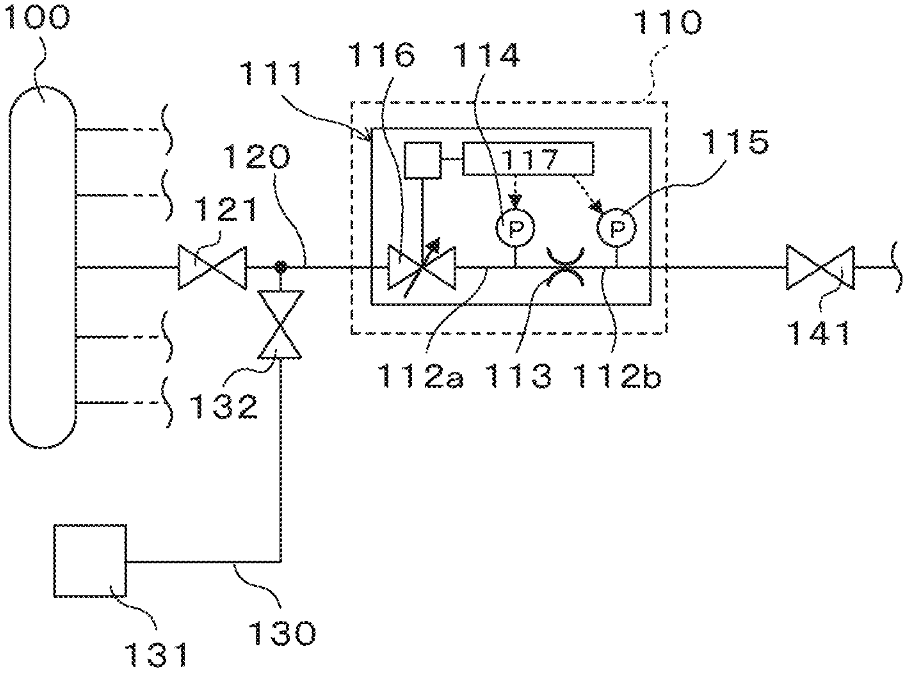
FIG. 18 is an explanatory view illustrating another configuration example of a gas supplier.

In the above embodiments, the flow rate control unit 110 includes the pressure-controlled flow rate controllers 111*c*, 111*m*, and 111*e*, but the number of the flow rate controllers 111 is not limited thereto. For example, as illustrated in FIG. 18, one flow rate controller 111 may be provided. The illustrated example is an example in which the interior of the flow rate control unit 110 is evacuated only from the upstream side of the flow rate control unit 110. The number of flow rate controllers 111 is not limited even in a configuration that allows the evacuation of the interior of the flow rate control unit 110 only from the downstream side of the flow rate control unit 110, or a configuration that allows the evacuation of the interior of the flow rate control unit 110 from each of the upstream and downstream sides of the flow rate control unit 110.

<Substrate Processing Method (Second Embodiment)>

Here, as described above, in the etching process on the substrate W, it is important to shorten the startup time of plasma inside the plasma processing chamber (hereinafter, referred to as "improving startup responsiveness"). However, as illustrated in the above embodiment, in the case where the flow rate controller 111 is evacuated (the first exhaust operation and the second exhaust operation) when starting the process again, when the secondary-side valve 141 is opened in a state in which there is a difference in internal pressure between the internal supply pipe 112 and the secondary-side supply pipe 140, for example, an inflow or the like of the Ar gas from the secondary-side supply pipe 140 to the internal supply pipe 112 occurs, which may cause a delay in the supply of the CF-based gas from the flow rate controller 111 to the plasma processing chamber 10 and may deteriorate the startup responsiveness of etching.

As described above, the flow rate of the argon gas supplied into the plasma processing chamber 10 is set to be larger than the flow rate of the CF-based gas supplied from the gas source 100*a* and the flow rate of the oxygen gas supplied from the gas source 100*b*. For this reason, the internal pressure of the secondary-side supply pipe 140, which is the opening destination of the secondary-side valve 141, has increased, so that there is a particular concern that the startup responsiveness will deteriorate.

Therefore, in the plasma processing according to the technology of the present disclosure, in order to suppress such deterioration of the startup responsiveness, prior to supplying the CF-based gas or the like to the plasma processing chamber 10, the flow rate controller 111 may be filled with gas and the internal pressure of the internal supply pipe 112 may be increased (hereinafter, referred to as a "pre-charging process"). Hereinafter, a substrate processing method according to a second embodiment, including this pre-charging process, will be described with reference to the drawings. In the following description, detailed descriptions of operations (steps) that are substantially the same as those in the above embodiments will be omitted.

Figure 19:
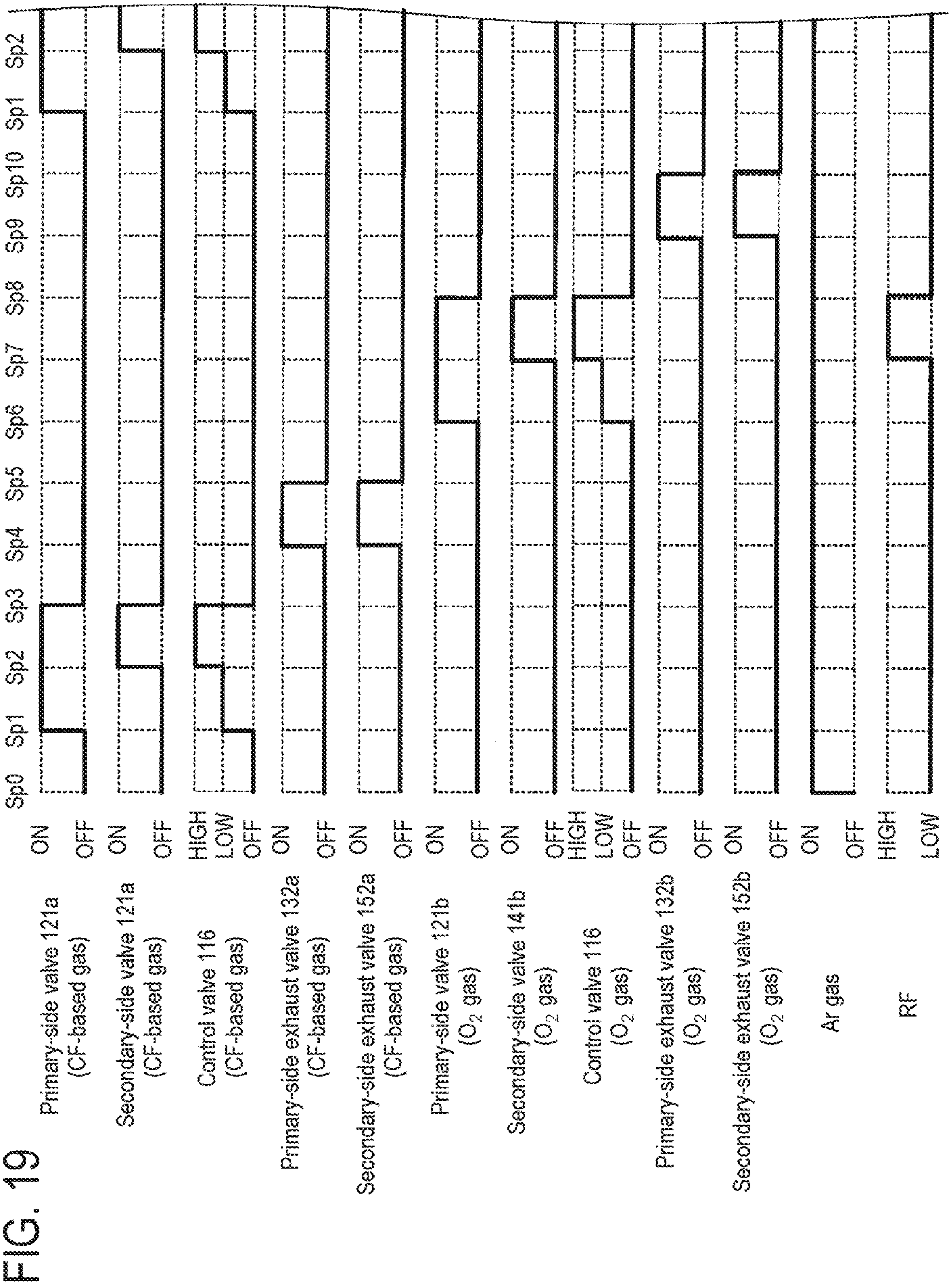
FIG. 19 is an explanatory view illustrating operation timings of various members in substrate processing according to a second embodiment.

FIG. 19 is a timing chart of substrate processing according to an embodiment. FIGS. 20A to 20F are explanatory views illustrating operations of the flow rate controller 111 in the main operations of wafer processing. In FIGS. 20A to 20F, three flow rate controllers 111*c*, 111*m*, and 111*e* included in the flow rate control unit 110 are illustrated as a flow rate controller 111. That is, it is assumed that the flow rate controller 111 illustrated in FIGS. 20A to 20F includes the flow rate controllers 111*c*, 111*m*, and 111*e*.

Similarly, it is assumed that the primary-side valve 121, the primary-side exhaust valve 132, the secondary-side valve 141, and the secondary-side exhaust valve 152 illustrated in FIGS. 20A to 20F include the primary-side valves 121*a* and 121*b*, the primary-side exhaust valves 132*a* and 132*b*, and the secondary-side valves 141*a* and 141*b* corresponding to the gas sources 100*a* and 100*b*, respectively.

Figure 20A:
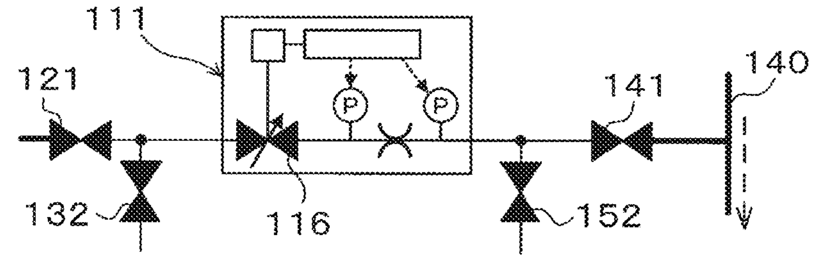
FIGS. 20A to 20F are explanatory views schematically illustrating states of an interior of a flow rate controller during the substrate processing according to the second embodiment.

In addition, before starting the etching on the substrate W in the plasma processing chamber 10, as illustrated in FIG. 20A, all of the primary-side valve 121, the primary-side exhaust valve 132, the control valve 116, the secondary-side valve 141, and the secondary-side exhaust valve 152 are closed to stop the supply of the gas into the plasma processing chamber 10. In addition, the interior of the flow rate controller 111 is evacuated.

When starting the etching on the substrate W in the plasma processing chamber 10, first, the supply of the Ar gas from another gas supplier 160 into the plasma processing chamber 10 starts (step Sp0 in FIG. 19). The Ar gas acts as a carrier gas in the etching, and is constantly supplied during a series of processes for the etching.

In addition, the Ar gas supplied into the plasma processing chamber 10 may be supplied from the gas source 100*c* in the same manner as in the above embodiment, instead of another gas supplier 160.

Figure 20B:
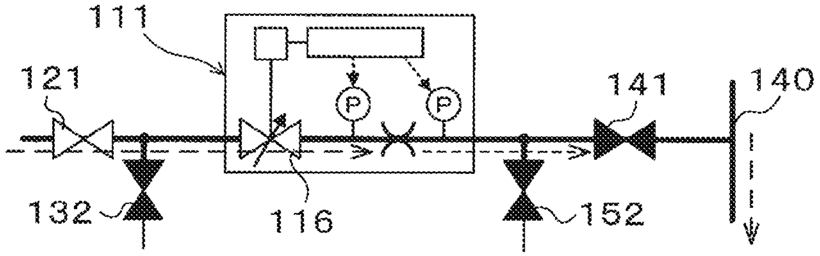

Subsequently, as illustrated FIG. 20B, only the primary-side valve 121*a* and the control valve 116 of the flow rate control unit 110*a* are opened (the secondary-side valve 141*a* is not opened) to start filling the flow rate controller 111 of the flow rate control unit 110*a* with the CF-based gas (step Sp1 in FIG. 19). In step Sp1, prior to supplying the CF-based gas to the plasma processing chamber 10, the flow rate controller 111 is filled with the CF-based gas so that the internal pressure of the internal supply pipe 112 is increased (in a first pre-charging process).

Here, the internal pressure of the secondary-side supply pipe 140, which is the opening destination of the secondary-side valve 141*a*, has increased with the supply of the Ar gas into the plasma processing chamber 10 in step Sp0. As a result, when the secondary-side valve 141*a* is opened in a state in which there is a difference in internal pressure between the internal supply pipe 112 and the secondary-side supply pipe 140, for example, an inflow or the like of the Ar gas from the secondary-side supply pipe 140 to the internal supply pipe 112 occurs, which may cause a delay in the supply of the CF-based gas from the flow rate controller 111 to the plasma processing chamber 10 and may deteriorate the startup responsiveness of etching.

Therefore, in the present embodiment, the flow rate controller 111 is filled with the CF-based gas prior to the supply of the CF-based gas, and the internal pressure of the internal supply pipe 112 (more specifically, the internal pressure P2 of the secondary-side internal supply pipe 112*b*) is increased. This makes it possible to reduce the difference in internal pressure between the internal supply pipe 112 and the secondary-side supply pipe 140, thereby suppressing deterioration in the startup responsiveness of etching.

It is desirable to increase the internal pressure of the internal supply pipe 112 to a level that substantially coincides with the internal pressure of the secondary-side supply pipe 140. Specifically, it is desirable to increase the internal pressure to about 80 to 120% of the internal pressure of the secondary-side supply pipe 140.

When the internal pressure of the internal supply pipe 112 is less than 80% of the internal pressure of the secondary-side supply pipe 140, the startup responsiveness of etching may deteriorate as described above.

Further, when the internal pressure of the internal supply pipe 112 exceeds 120% of the internal pressure of the secondary-side supply pipe 140, the CF-based gas may flow all at once from the internal supply pipe 112 into the plasma processing chamber 10, causing the above-mentioned spike S to occur.

In addition, it is desirable to fill the flow rate controller 111 with the CF-based gas at a flow rate smaller than at least the flow rate of the CF-based gas supplied in the deposition operation (step Sp2), which will be described later. More specifically, as illustrated in FIG. 19, it is desirable that the opening degree of the control valve 116 at the time of filling the flow rate controller 111 with the CF-based gas is controlled to be smaller than the opening degree of the control valve 116 in the deposition operation (step Sp2).

Figure 20C:
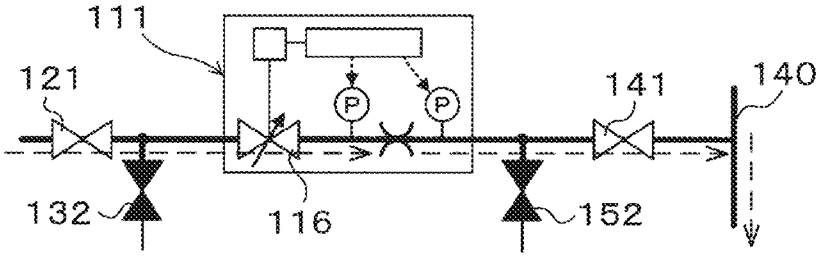

When the internal pressure of the internal supply pipe 112 is increased to a desired pressure, then, as illustrated in FIG. 20C, the secondary-side valve 141*a* is opened to supply the CF-based gas into the plasma processing chamber 10, that is, to start the above-described deposition operation (step Sp2 in FIG. 19).

Figure 20D:
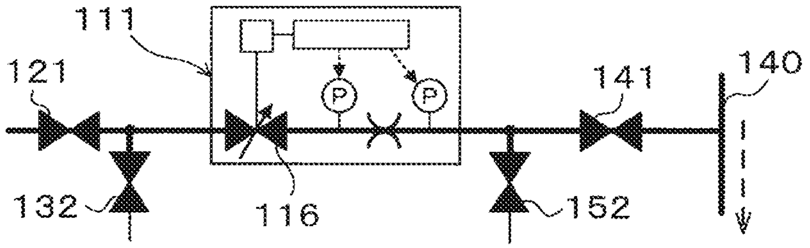

After the CF-based deposit is formed on the substrate W, as illustrated in FIG. 20D, the primary-side valve 121*a*, the control valve 116, and the secondary-side valve 141*a* of the flow rate control unit 110*a* are closed to stop the supply of the CF-based gas into the plasma processing chamber 10 (step Sp3 in FIG. 19).

Figure 20E:
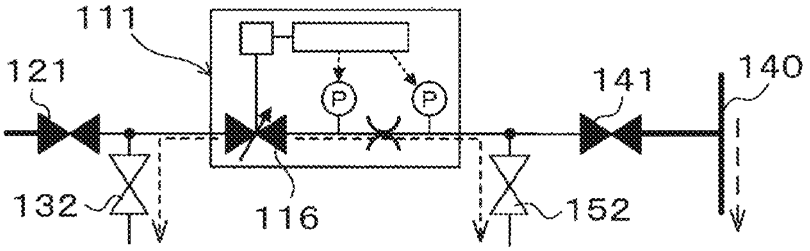

Subsequently, as illustrated in FIG. 20E, the primary-side exhaust valve 132*a* and the secondary-side exhaust valve 152*a* of the flow rate control unit 110*a* are opened to exhaust the interior of the flow rate control unit 110*a* (the flow rate controller 111) that has supplied the CF-based gas (in the first exhaust operation: step Sp4 in FIG. 19).

Figure 20F:
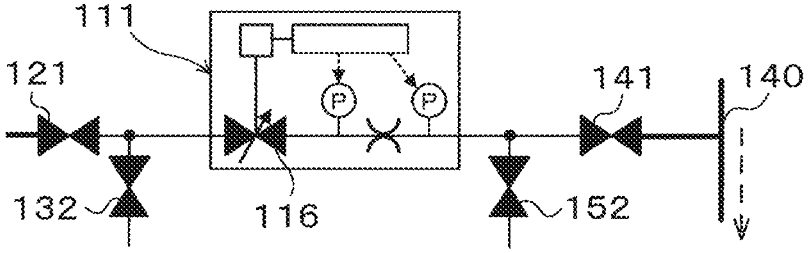

Subsequently, as illustrated in FIG. 20F, the primary-side exhaust valve 132*a* and the secondary-side exhaust valve 152*a* are closed to stop the exhaust from the flow rate control unit 110*a* (step Sp5 in FIG. 19).

In addition, after the first exhaust operation (step Sp4) is completed, it may be checked whether the residual gas in the flow rate controller 111*a* has been properly exhausted by opening the control valve 116 of the flow rate controller 111*a* and the secondary-side valve 141*a* of the flow rate control unit 110*a*.

Further, in the above description, the control valve 116 was closed in step Sp3 (see FIGS. 19 and 20A to 20F). However, the timing of closing the control valve 116 is not limited to this. From the viewpoint of appropriately exhausting the interior of the flow rate controller 111 illustrated in the first embodiment, it is desirable to close the control valve 116 after the first exhaust operation (step Sp4).

Subsequently, the primary-side valve 121*b* and the control valve 116 of the flow rate control unit 110*b* are opened (see FIG. 20B) to start filling the flow rate controller 111 of the flow rate control unit 110*b* with the $O_2$ gas (step Sp6 in FIG. 19). In step Sp6, prior to supplying the $O_2$ gas to the plasma processing chamber 10, the flow rate controller 111 is filled with the $O_2$ gas to increase the internal pressure of the internal supply pipe 112 (in a second pre-charging process).

In addition, it is desirable to increase the internal pressure of the internal supply pipe 112 (more specifically, the internal pressure P2 of the secondary-side internal supply pipe 112*b*) to a level that substantially coincides with the internal pressure of the secondary-side supply pipe 140. Specifically, it is desirable to increase the internal pressure to about 80 to 120% of the internal pressure of the secondary-side supply pipe 140. When the internal pressure of the internal supply pipe 112 is less than 80% of the internal pressure of the secondary-side supply pipe 140, the startup responsiveness of etching may deteriorate as described above.

Further, when the internal pressure of the internal supply pipe 112 exceeds 120% of the internal pressure of the secondary-side supply pipe 140, the $O_2$-based gas may flow all at once from the internal supply pipe 112 into the plasma processing chamber 10, causing the above-mentioned spike S to occur.

In addition, it is desirable to fill the flow rate controller 111 with the $O_2$-based gas at a flow rate smaller than at least the flow rate of the $O_2$-based gas supplied in the etching operation (step Sp7) to be described later. More specifically, as illustrated in FIG. 19, it is desirable that the opening degree of the control valve 116 at the time of filling the flow rate controller 111 with the $O_2$-based gas is controlled to be smaller than the opening degree of the control valve 116 in the etching operation (step Sp7).

After the internal pressure of the internal supply pipe 112 is increased to a desired pressure, the secondary-side valve 141*b* is opened (see FIG. 20C) to start the supply of the $O_2$ gas into the plasma processing chamber 10. At the same time, the supply of an RF signal (RF power) from the RF power supply 31 to the lower electrode and/or the upper electrode of the substrate support 11 starts, and the above-described etching operation starts (step Sp7 in FIG. 19).

In addition, in the timing chart illustrated in FIG. 19, the supply of the $O_2$ gas into the plasma processing chamber 10 (opening of the secondary-side valve 141*a*) and the supply of the RF signal (RF power) from the RF power supply 31 are performed approximately simultaneously. However, it takes time for the $O_2$ gas to actually reach the interior of the plasma processing chamber 10 after the secondary-side valve 141*a* is opened. In view of this, it is desirable to supply the RF signal (RF power) at a timing shifted from the opening of the secondary-side valve 141*a*.

When the etching of the substrate W is completed, the primary-side valve 121*b*, the control valve 116, and the secondary-side valve 141*b* of the flow rate control unit 110*b* are closed to stop the supply of the $O_2$ gas into the plasma processing chamber 10 (step Sp8 in FIG. 19: see FIG. 20D).

Subsequently, as illustrated in FIG. 20E, the primary-side exhaust valve 132*b* and the secondary-side exhaust valve 152*b* of the flow rate control unit 110*b* are opened to exhaust the interior of the flow rate control unit 110*b* (the flow rate controller 111) that has supplied the $O_2$ gas (in the second exhaust operation: step Sp9 in FIG. 19).

Subsequently, as illustrated in FIG. 20F, the primary-side exhaust valve 132*b* and the secondary-side exhaust valve 152*b* of the flow rate control unit 110*b* are closed to stop the exhaust from the flow rate control unit 110*b* (step Sp10 in FIG. 19).

In addition, after the second exhaust operation (step Sp9) is completed, it may be checked whether the residual gas in the flow rate controller 111*b* has been properly exhausted by opening the control valve 116 of the flow rate controller 111*b* and the secondary-side valve 141*b* of the flow rate control unit 110*b*.

Further, in the above description, the control valve 116 was closed in step Sp8 (see FIGS. 19 and 20A to 20F). However, the timing of closing the control valve 116 is not limited to this. From the viewpoint of appropriately exhausting the interior of the flow rate controller 111 illustrated in the first embodiment, it is desirable to close the control valve 116 after the second exhaust operation (step Sp9).

In the present embodiment, the cycle including the deposition process (the first process: steps Sp1 to Sp5) and the etching process (the second process: steps Sp6 to Sp10) is repeated until a desired amount of etching is obtained on the substrate W.

Thereafter, after a desired number of cycles is repeated, it is determined whether additional processes for the etching (the deposition process and the etching process) are necessary. When it is determined to be necessary, the process returns to step Sp1, as illustrated in FIG. 19, and the first process and the second process are repeated. In addition, when it is determined that additional process cycles for etching are unnecessary, a series of etchings is terminated.

In the above embodiment, in one cycle, the first pre-charging process (step Sp1), the deposition operation (step Sp2), the first exhaust operation (step Sp4), the second pre-charging process (step Sp6), the etching operation (step Sp7), and the second exhaust operation (step Sp10) were sequentially performed, but the etching method is not limited thereto.

Figure 21:
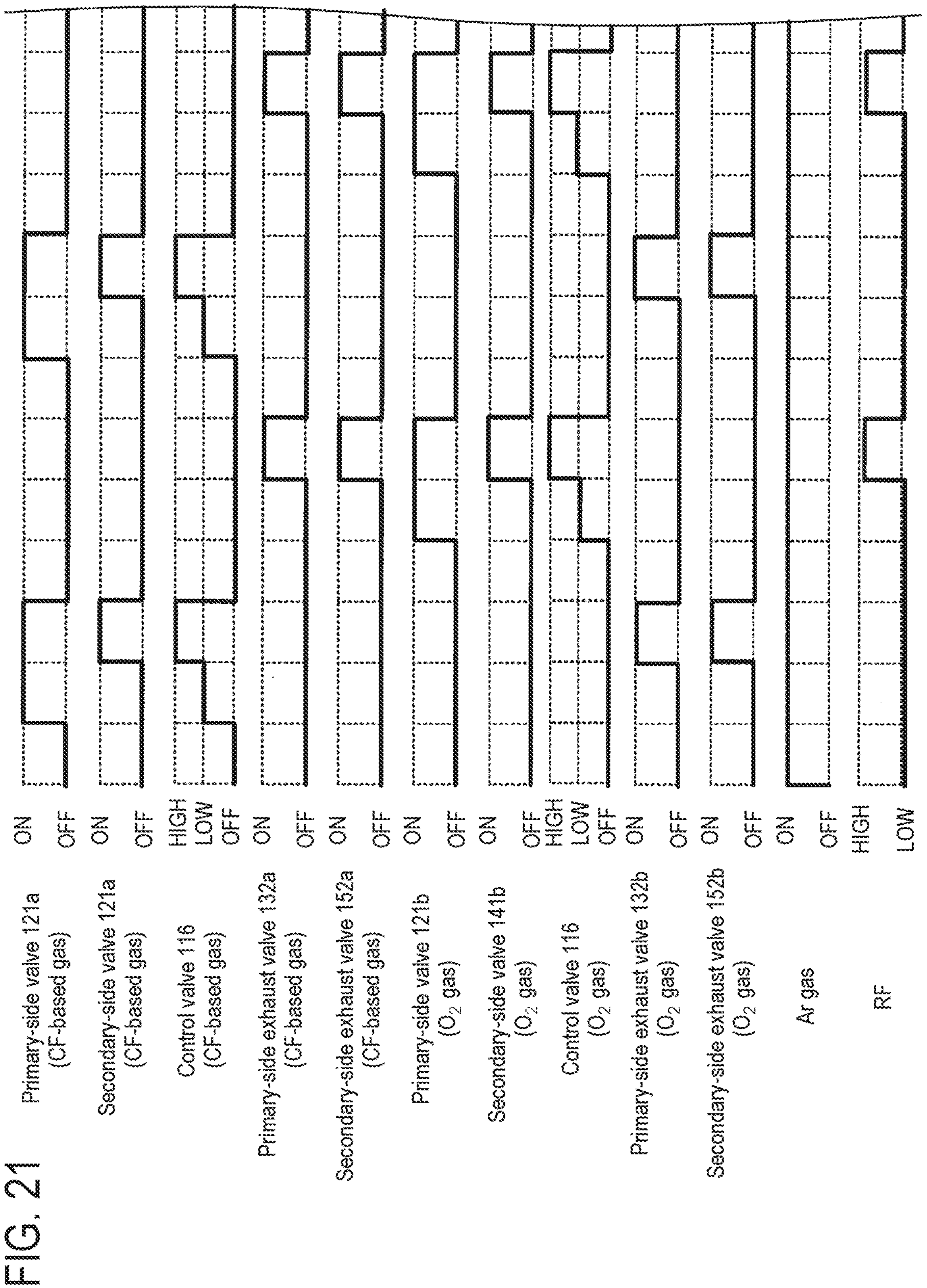
FIG. 21 is an explanatory view illustrating operation timings of various members in substrate processing according to another embodiment.

For example, as illustrated in FIG. 21, the second exhaust operation (exhausting the interior of the flow rate control unit 110*b*) may be performed during the deposition operation (the supply of the CF-based gas from the flow rate control unit 110*a*). Similarly, the first exhaust operation (exhausting the interior of the flow rate control unit 110*a*) may be performed during the etching operation (the supply of the $O_2$ gas from the flow rate control unit 110*b*).

In this way, when one flow rate control unit 110 performs the gas supply, by performing the exhaust operation of other flow rate control units 110 that do not perform the gas supply at the same time, it is possible to improve the throughput related to etching.

In addition, in the above embodiment, while the supply of the gas into the plasma processing chamber 10 in one flow rate control unit 110 is stopped (during the first process or the second process), the exhaust of the one flow rate control unit 110 (the first exhaust operation or the second exhaust operation) and the gas filling (the pre-charging process) were sequentially performed, but the exhaust operation and the pre-charging process may be omitted as appropriate.

Figure 22:
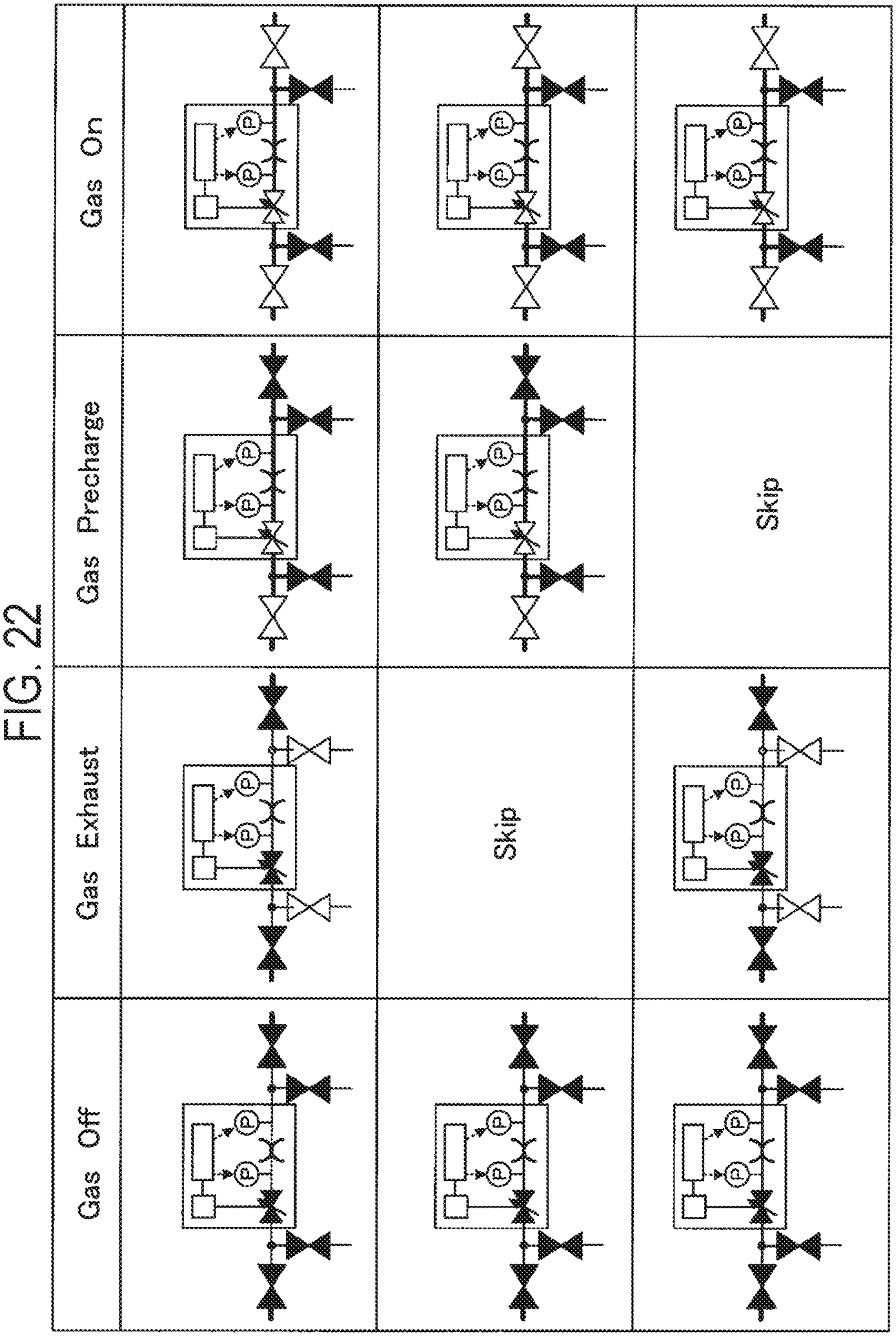
FIG. 22 is an explanatory view schematically illustrating states of an interior of a flow rate controller during substrate processing according to another embodiment.

Specifically, as illustrated in FIG. 22, for example, when only one type of gas is supplied to one flow rate control unit 110 (having a structure of one system), after the first process or the second process is completed, depending on the internal pressure of the flow rate control unit 110, the exhaust operation may be omitted and the pre-charging process may be performed immediately. More specifically, for example, when it is determined that the internal pressure of the flow rate control unit 110 substantially coincides with the internal pressure of the secondary-side supply pipe 140 so that the gas supply may appropriately start at the beginning of the next process, the exhaust operation may be omitted.

For example, as illustrated in FIG. 22, when the flow rate of the Ar gas supplied from another gas supplier 160 is small and thus the internal pressure of the secondary-side supply pipe 140 is low, the pre-charging process may be omitted and a processing process may start after the exhaust process is completed.

Figure 23:
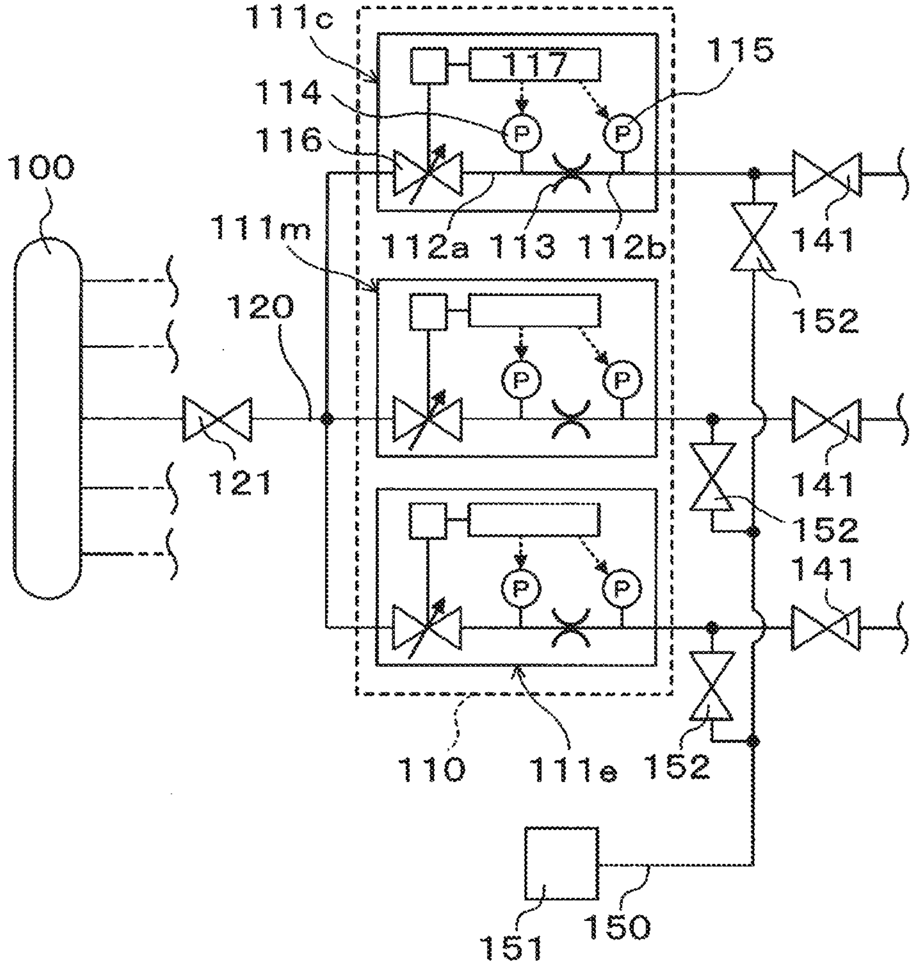
FIG. 23 is an explanatory view illustrating another configuration example of a gas supplier.

Further, in the above embodiment, as illustrated in FIGS. 4 to 7, the interior of the flow rate control unit 110 may be evacuated from each of the upstream and downstream sides of the flow rate control unit 110. However, in the present embodiment (the second embodiment), the exhaust unit (the exhaust unit 131 or the exhaust unit 151 in the illustrated example) may be connected to at least the upstream side or the downstream side of the flow rate control unit 110. In other words, in particular, according to the present embodiment (the second embodiment), as illustrated in FIG. 16, the flow rate control unit 110 according to the technology of the present disclosure may include only the primary-side exhaust pipe 130, the exhaust unit 131, and the primary-side exhaust valve 132 and may not include the secondary-side exhaust pipe 150, the exhaust unit 151, and the secondary-side exhaust valve 152. Alternatively, as illustrated in FIG. 23, the flow rate control unit 110 may include only the secondary-side exhaust pipe 150, the exhaust unit 151, and the secondary-side exhaust valve 152 and may not include the primary-side exhaust pipe 130, the exhaust unit 131, and the primary-side exhaust valve 132. In this case as well, effects described below may be provided.

<Effects or the like of Substrate Processing According to Second Embodiment>

As described above, with the plasma processing apparatus 1 according to the second embodiment, prior to the supply of the gas into the plasma processing chamber 10, the flow rate controller 111 is filled with the gas, and the internal pressure of the internal supply pipe 112 is increased (in the pre-charging process). The internal pressure of the internal supply pipe 112 after the pre-charging process (more specifically, the internal pressure P2 of the secondary-side internal supply pipe 112*b*) is, for example, a pressure that substantially coincides with the internal pressure of the secondary-side supply pipe 140, specifically, a pressure of about 80 to 120% of the internal pressure of the secondary-side supply pipe 140.

This makes it possible to reduce the difference in internal pressure between the internal supply pipe 112 and the secondary-side supply pipe 140, to suppress the inflow of the argon gas or the occurrence of the spike S at the time of opening the secondary-side valve 141, and to suppress deterioration in the startup responsiveness at the time of etching.

Figure 24:
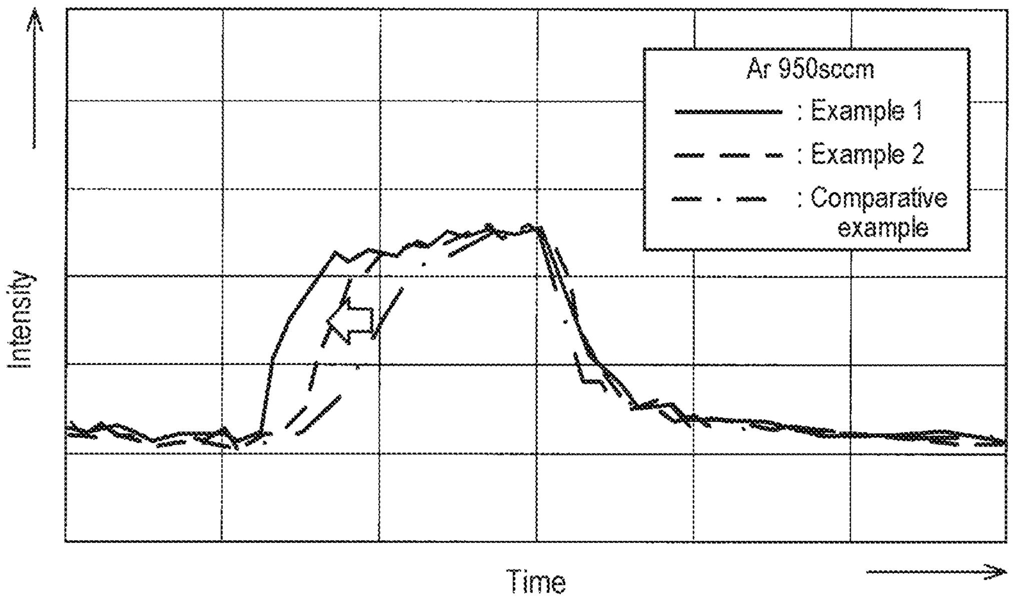
FIG. 24 is a graph illustrating effects of a control method according to the second embodiment.

FIG. 24 is a graph illustrating results of a study on a gas responsiveness of plasma processing in the processing method according to the present embodiment.

In FIG. 24, the solid line indicates the result in the case where the $O_2$ gas was pre-charged at the flow rate of 0.9 sccm for 0.5 seconds (Example 1), the broken line indicates the result in the case where the $O_2$ gas was pre-charged at the flow rate of 0.9 sccm for 0.2 seconds (Example 2), and the one-dot chain line indicates the result in the case where no pre-charge was performed (Comparative Example).

In addition, in the present study, in all of Examples 1 and 2 and Comparative Example, the Ar gas was continuously supplied from another gas supplier 160 at the flow rate of 950 sccm.

As illustrated in FIG. 24, it may be seen that by filling the flow rate controller 111 with gas before supplying the gas to the plasma processing chamber 10, the startup responsiveness may be improved (that is, it may be seen that the slope of the graph illustrated in FIG. 24 may be increased).

At this time, it was also found that as the pre-charging process is performed for a longer time, the startup responsiveness could be improved (that is, it was found that the slope of the graph illustrated in FIG. 24 could be increased). This is thought to be due to the fact that when gas supply is performed at a constant flow rate, as the pre-charging process is performed for a longer time, the difference in internal pressure between the internal supply pipe 112 and the secondary-side supply pipe 140 becomes smaller.

In the pre-charging process according to the present embodiment, it is desirable to determine the time for the pre-charging process such that the internal pressure of the internal supply pipe 112 and the internal pressure of the secondary-side supply pipe 140 are approximately equal to each other (approximately 80 to 120% of the internal pressure of the secondary-side supply pipe 140).

In the above embodiment, after the internal pressure of the internal supply pipe 112 is increased to a desired pressure in the pre-charging process, the secondary-side valve 141 is opened to start various processing processes, but the starting conditions for processing processes (opening conditions for opening the secondary-side valve 141) are not limited to the internal pressure of the internal supply pipe 112.

For example, in the above embodiment, the timing of opening the secondary-side valve 141 is determined by measuring the internal pressure of the internal supply pipe 112, but conversely, the timing of opening the secondary-side valve 141 is determined in advance and the internal pressure of the internal supply pipe 112 may be regulated accordingly.

In such a case, the timing of opening the secondary-side valve 141 may be determined based on, for example, the timing of starting the supply of the Ar gas from another gas supplier 160 in step Sp0.

In the pre-charging process before various processing processes, the opening degree of the control valve 116 is appropriately regulated such that the internal pressure of the internal supply pipe 112 reaches a desired value at the timing of opening of the secondary-side valve 141 determined as described above.

That is, for example, when the internal pressure of the internal supply pipe 112 is predicted to be higher than a desired value at the timing of opening the secondary-side valve 141, the opening degree of the control valve 116 is controlled to be decreased. In addition, for example, when the internal pressure of the internal supply pipe 112 is predicted to be lower than a desired value at the timing of opening the secondary-side valve 141, the opening degree of the control valve 116 is controlled to be increased.

In the above embodiment, the timing of opening the secondary-side valve 141 is determined based on the internal pressure of the internal supply pipe 112 where the pre-charging process has been performed, but instead of or in addition to the internal pressure of the internal supply pipe 112, the timing of opening the secondary-side valve 141 may be set based on other parameters.

Specifically, for example, instead of or in addition to the internal pressure of the internal supply pipe 112, the conditions may be set by using, as parameters, the flow rate of the gas supplied from the flow rate controller 111, the gas supply time, the internal temperature of the flow rate controller 111, the flow rate of the Ar gas flowing through the secondary-side supply pipe 140, a machine difference of the control valve 116, and the like.

In addition to the timing of opening the secondary-side valve 141, the opening degree of the control valve 116 may be further regulated by using, as parameters, the flow rate of the gas supplied from these flow rate controllers 111, the internal temperature of the flow rate controller 111, the flow rate of the Ar gas flowing through the secondary-side supply pipe 140, and the like.

The pre-charging process performed as described above may be applied in various aspects represented in the following Phases.

Phase 1

The pre-charging process may be executed based on a predetermined limited model recipe prior to the initiation of plasma processing. Specifically, as described above, conditions such as the gas flow rate and gas supply time for pre-charge may be determined in advance, and the pre-charging process may be executed according to the determined conditions (for example, the gas flow rate).

According to Phase 1, the plasma processing on the substrate W may be appropriately performed by improving the startup responsiveness and setting conditions in which no spike occurs in advance.

Phase 2

By performing calculation from the flow rate of the Ar gas as a carrier gas, the temperature of the shower head 13, the flow rate ratio of the gases supplied to each of the gas supply ports 14*c*, 14*m*, and 14*e* of the shower head 13, and the like, or measuring the internal pressure P2 with the pressure sensor 115, the above-described pre-charging process may be automatically performed under appropriate conditions (for example, a flow rate of supplied gas and a filling amount).

According to Phase 2, the pre-charging process is appropriately controlled based on various measurement results and calculation results. As a result, the pre-charging process may be appropriately changed in accordance with the internal states of the flow rate controller 111 and the plasma processing chamber 10, so that more appropriate plasma processing results may be obtained compared to Phase 1.

Phase 3

The above-described pre-charging process may be executed by using the flow rate control unit 110 or the flow rate controller 111 equipped with an internal pressure control mechanism for controlling the internal pressure of the internal supply pipe 112 (more specifically, the internal pressure P2 of the secondary-side internal supply pipe 112*b*).

According to Phase 3, there is an advantage in that there is no need to strictly control the filling amount before opening the valve. Further, since the internal pressure control mechanism allows for unified control, the influence of individual differences in the flow rate control unit 110 or the flow rate controller 111 and the influence of variation in control reproduction may be alleviated.

<Other Effects or the like of Technology of the Present Disclosure>

Here, in the plasma processing apparatus 1 according to the technology of the present disclosure, as described above, the cycle including the first process and the second process is repeatedly and alternately performed on the substrate W. Therefore, in each flow rate controller 111, supplying the gas to the plasma processing chamber 10 (the exhaust by the exhaust unit 151) and stopping the supply of the gas are repeatedly executed.

At this time, in the plasma processing apparatus in the related art in which the exhaust line (the secondary-side exhaust pipe 150 and the exhaust unit 151) is not connected to the downstream side of the orifice 113, it was necessary to stop the supply of the gas from the gas source 100 each time (to close the primary-side valve 121 each time) to prevent the internal pressure of the flow rate controller 111 from rising and causing the spike S. In other words, it was necessary to execute the control of the gas flow rate by the flow rate controller 111 for each cycle that is repeatedly executed, and it took time to switch between the supplying the gas to the plasma processing chamber 10 and the stopping the supply of the gas.

In this regard, according to the plasma processing apparatus 1 of the present embodiment, the exhaust line (the secondary-side exhaust pipe 150 and the exhaust unit 151) is connected to the downstream side of the orifice 113. Therefore, when stopping the supply of the gas into the plasma processing chamber 10, there is no need to stop the supply of the gas from the gas source 100 (close the primary-side valve 121), and the secondary-side exhaust valve 152 may be opened to continue the exhaust at a constant flow rate (the supply flow rate to the plasma processing chamber 10). In other words, it is possible to switch between supplying the gas to the plasma processing chamber 10 and stopping the supply of the gas only by repeatedly opening and closing the secondary-side valve 141 and the secondary-side exhaust valve 152. At this time, there is no need for the flow rate controller 111 to control the gas flow rate. That is, the control of the gas flow rate by the flow rate controller 111, which has been executed for each repeatedly executed cycle in the related art, may be omitted, and the supply of the gas into the plasma processing chamber 10 may be instantly started again at a desired constant flow rate.

In the above embodiment, the orifice 113 as a control-side orifice for controlling the gas flow rate in the gas supplier 20 is arranged only inside the flow rate controller 111, but another orifice for controlling the gas flow rate may be further provided in the gas supply flow path.

Here, there is a minimum process limitation for a hole diameter of the orifice provided in the gas supply flow path. As a result, in principle, a gas cannot flow through the gas supply flow path at an extremely small flow rate that is equal to or less than the flow rate which is controllable with the hole diameter at the minimum processing limit.

Figure 25:
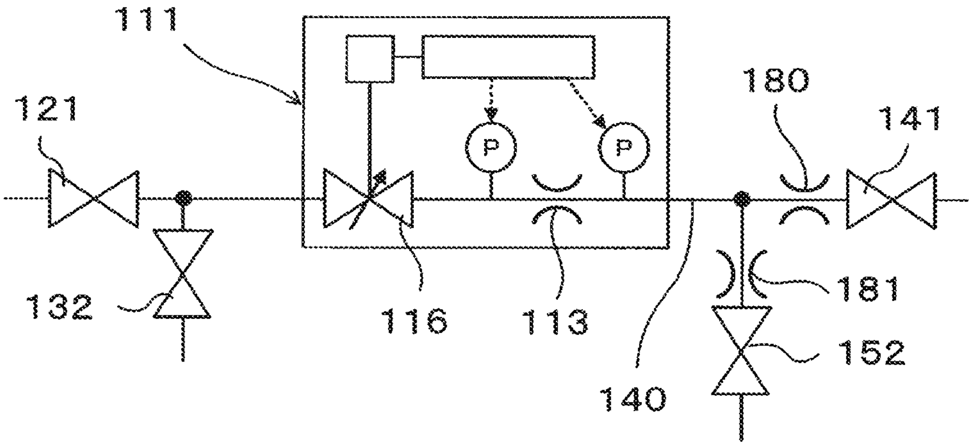
FIG. 25 is an explanatory view illustrating another configuration example of the gas supplier.

However, the present inventors conducted a study and discovered the possibility of supplying the gas at an extremely low flow rate by providing an orifice 180 as a chamber-side orifice and an orifice 181 as an exhaust-side orifice between a connection portion of the secondary-side supply pipe 140 with the secondary-side exhaust pipe 150 and the secondary-side valve 141, and on the upstream side of the of the secondary-side exhaust valve 52 in the secondary-side exhaust pipe 150, respectively, as illustrated in FIG. 25.

Specifically, the orifice 113 arranged inside the flow rate controller 111 is configured to have a hole diameter at the minimum process limitation, and the orifices 180 and 181 provided on the downstream side of the orifice 113 are configured to have different diameters.

As a result, the gas supplied from the gas source 100 to the flow rate controller 111 is first introduced into the secondary-side supply pipe 140 by the orifice 113 at the minimum flow rate that is controllable with the hole diameter at the minimum processing limit. The gas introduced into the secondary-side supply pipe 140 is branched at the connection portion with the secondary-side exhaust pipe 150. At this time, since the orifices 180 and 181 are configured to have different hole diameters, the flow rate ratio of the gas flowing toward the orifice 180 (the plasma processing chamber 10) and the orifice 181 (the exhaust unit 151) changes according to the ratio of the hole diameters. That is, for example, when the ratio of the hole diameters of the orifices 180 and 181 is 1:4, 20% of the gas at the minimum flow rate introduced into the secondary-side supply pipe 140 flows toward the plasma processing chamber 10, and the remaining 80% flows toward the exhaust unit 151.

As described above, according to the present embodiment, by further providing other orifices 180 and 181 for controlling the gas flow rate in the gas supply flow path, it is possible to supply the gas to the plasma processing chamber at an extremely low flow rate that is lower than the flow rate which is controllable with the hole diameter of the orifice 113 at the minimum process limitation. At this time, the ratio of the hole diameters of the orifices 180 and 181 is determined based on the ratio of the target gas flow rate supplied to the plasma processing chamber 10 to the minimum gas flow rate output from the orifice 113. This makes it possible to control the processing on the substrate W in the plasma processing chamber 10 more precisely.

In the example illustrated in FIG. 25, the flow rate ratio of the gas flowing toward the plasma processing chamber 10 and the gas flowing toward the exhaust unit 151 is controlled by providing the orifices 180 and 181 with different hole diameters, but the method of controlling the flow rate ratio is not limited thereto. Specifically, when the sizes of the flow paths of the secondary-side exhaust pipe 150 and the secondary-side supply pipe 140 on the downstream side of the connection portion with the secondary-side exhaust pipe 150 are different, the gas flow rate ratio may be controlled.

For example, instead of providing the orifices 180 and 181, each of the secondary-side valve 141 and the secondary-side exhaust valve 152 may be configured with a valve with an adjustable opening degree, such as a needle valve.

In addition, in the plasma processing apparatus, the orifice provided in the flow rate controller is used to calculate the gas flow rate flowing through the gas supply flow path. However, in a case where impurities and the like are attached to or accumulated in the hole of the orifice, the gas flow rate may not be calculated appropriately. For this reason, in the plasma processing apparatus in the related art, self-diagnosis (checking the validity of a calculated gas flow rate) using a fall characteristic of an orifice has been performed.

In the related art, in the self-diagnosis for an orifice, gas filled into a flow rate controller is exhausted from a plasma processing chamber by closing a primary-side valve and a primary-side exhaust valve and opening a secondary-side valve. At this time, it is determined (self-diagnosis) whether the calculated gas flow rate is valid by checking whether the exhaust characteristic, which is a pressure drop rate of the flow rate controller with respect to the exhaust time, is appropriate (for example, whether there is any change from the state at the time of shipment).

However, when performing the self-diagnosis by using such a method in the related art, since the flow rate controller is exhausted from the side of the plasma processing chamber, the self-diagnosis for the orifice and the processing of the substrate W in the plasma processing chamber may not be performed in parallel.

However, in this respect, with the plasma processing apparatus 1 according to the present embodiment, the flow rate controller 111 may be exhausted by using the exhaust unit 151 connected to the secondary-side supply instead of the exhaust system 40 connected to the plasma processing chamber 10. That is, the self-diagnosis for the orifice 113 may be performed independently of the processing of the substrate W in the plasma processing chamber 10 (in parallel with the processing of the substrate W).

Therefore, there is no need to stop the processing of the substrate W during the self-diagnosis for the orifice 113, so that productivity in the plasma processing apparatus 1 may be improved. In addition, since the self-diagnosis may be performed independently of the processing of the substrate W in this way, the self-diagnosis may be performed at any timing, such as every time a single substrate W is processed in the plasma processing chamber 10 or every step of the processing of the substrate W illustrated in FIG. 9 and the like, and the number of scraps of the substrate W may be appropriately reduced.

In addition, in the plasma processing apparatus 1 according to the present embodiment, the self-diagnosis for the two pressure sensors 114 and 115 provided in the flow rate controller may be performed independently of the processing of the substrate W, similar to the above-described self-diagnosis for the orifice (in parallel with the processing of the substrate W).

Specifically, the gas filled into the flow rate controller 111 is exhausted by the exhaust unit 151 by closing the primary-side valve 121 and the primary-side exhaust valve 132 and opening the secondary-side exhaust valve 152. At this time, by measuring the internal pressure of the flow rate controller 111 with the two pressure sensors 114 and 115 and comparing the measurement results with each other, it may be checked whether a zero point deviation or span deviation has occurred between these two pressure sensors 114 and 115.

More specifically, by mutually comparing the measurement results from the two pressure sensors 114 and 115 when the internal pressure of the flow rate controller 111 is increased with the gas filled and when the gas is exhausted by the exhaust unit 151, it may be checked whether a span deviation has occurred between these two pressure sensors 114 and 115.

In addition, after the gas in the flow rate controller 111 is sufficiently exhausted and the interior of the flow rate controller 111 is further evacuated, by comparing the measurement results from the two pressure sensors 114 and 115 with each other, it may be checked whether a zero point deviation has occurred between the pressure sensors 114 and 115.

The self-diagnosis for these pressure sensors 114 and 115 may be performed in parallel with the above-described self-diagnosis for the orifice 113. That is, for example, when the interior of the flow rate controller 111 is filled with gas prior to the self-diagnosis for the orifice 113, the span deviation between the pressure sensors 114 and 115 may be checked. Further, after the filled gas is exhausted and the self-diagnosis for the orifice 113 is performed, the zero point deviation between the pressure sensors 114 and 115 may be checked by measuring the internal pressure of the flow rate controller 111 after evacuation.

As illustrated in FIGS. 4 and 5, in the gas supplier 20 according to the above embodiments, the secondary-side exhaust pipes 150 connected to correspond to respective flow rate controllers 111 are each exhausted by the exhaust unit 151 after joining to the downstream sides of the secondary-side exhaust valves 152.

In view of this, in a case where the gases simultaneously exhausted from the respective secondary-side exhaust pipes 150 contain mixing-inhibited gases, it is desirable to control the opening and closing of each secondary-side exhaust valve 152 such that the mixing-inhibited gases do not mix with each other in the exhaust line. More specifically, when exhausting two or more types of gases that are dangerous to mix, it is desirable to empty the exhaust line for a predetermined delay time (for example, 100 msec) after individually exhausting one gas, and then to individually exhaust other gases.

Combinations of mixing-prohibited gases include a combination of a hydrogen ($H_2$) gas and an oxygen ($O_2$) gas, a combination of a hydrogen bromide (HBr) gas and a chlorine ($Cl_2$) gas, a combination of an ammonia ($NH_3$) gas and a chlorine ($Cl_2$) gas, and the like.

It is to be considered that the embodiments disclosed herein are exemplary in all respects and not restrictive. Various types of omissions, substitutions, and changes may be made to the above-described embodiments without departing from the scope and spirit of the appended claims.

The following configurations also fall within the technical features of the present disclosure.

(1) A gas supply system for supplying gas into a processing chamber, includes: a plurality of gas supply flow paths configured to independently supply a gas to a processing chamber; a flow rate controller arranged in each of the gas supply flow paths; a primary-side valve arranged on the upstream side of the flow rate controller in each of the gas supply flow paths; a primary-side gas exhaust flow path which is branched between the primary-side valve and the flow rate controller in each of the gas supply flow paths and is connected to a primary-side exhaust mechanism; a primary-side exhaust valve arranged in the primary-side gas exhaust flow path; a secondary-side valve arranged on the downstream side of the flow rate controller in each of the gas supply flow paths; a secondary-side gas exhaust flow path which is branched between the secondary-side valve and the flow rate controller in the gas supply flow paths and is connected to a secondary-side exhaust mechanism; and a secondary-side exhaust valve arranged in the secondary-side gas exhaust flow path, wherein the flow rate controller has a control valve connected to the primary-side valve and the secondary-side valve, and a control-side orifice arranged between the control valve and the secondary-side valve.

(2) The substrate processing system of (1) above further includes: an exhaust-side orifice arranged on the upstream side of the secondary-side exhaust valve in the secondary-side gas exhaust flow path; and a chamber-side orifice arranged between a connection portion of each of the plurality of gas supply flow paths with the secondary-side gas exhaust flow path and the secondary-side valve, wherein the control-side orifice has a hole diameter of a minimum process limitation, and the exhaust-side orifice and the chamber-side orifice have different hole diameters.

(3) In the gas supply system of (2) above, a ratio of the hole diameters of the exhaust-side orifice and the chamber-side orifice is determined based on the ratio of a target flow rate supplied to the processing chamber to the flow rate of a gas output from the control-side orifice.

(4) In the gas supply system of any one of (1) to (3) above, the plurality of gas supply flow paths are connected to the processing chamber after joining to the downstream side of the secondary-side valve.

(5) In the gas supply system of any one of (1) to (4) above, each of the plurality of gas supply flow paths includes a plurality of branch supply pipes configured to independently supply a gas to a plurality of different positions inside the processing chamber, and the flow rate controller, the secondary-side valve, the secondary-side gas exhaust flow path, and the secondary-side exhaust valve are independently connected to each of the plurality of branch supply pipes.

(6) In the gas supply system of (5) above, each of the plurality of gas supply flow paths branches into the plurality of branch supply pipes between a connection portion with the primary-side gas exhaust flow path and the flow rate controller.

(7) In the gas supply system of (5) or (6) above, the plurality of branch supply pipes are configured to independently supply the gas to at least an edge region and a center region of a substrate introduced into the processing chamber.

(8) A plasma processing apparatus for processing a substrate includes: a processing chamber; a substrate support arranged inside the processing chamber; the gas supply system of any one of (1) to (7) above for supplying a gas into the processing chamber; and a plasma generator configured to generate plasma from the gas in the processing chamber.

(9) There is provided a gas supply method using a gas supply system including: a plurality of gas supply flow paths configured to independently supply a gas to a processing chamber; a flow rate controller arranged in each of the gas supply flow paths; a primary-side valve arranged on the upstream side of the flow rate controller in each of the gas supply flow paths; a primary-side gas exhaust flow path which is branched between the primary-side valve and the flow rate controller in each of the gas supply flow paths and is connected to a primary-side exhaust mechanism; a primary-side exhaust valve arranged in the primary-side gas exhaust flow path; a secondary-side valve arranged on the downstream side of the flow rate controller in each of the gas supply flow paths; a secondary-side gas exhaust flow path which is branched between the secondary-side valve and the flow rate controller in the gas supply flow paths and is connected to a secondary-side exhaust mechanism; and a secondary-side exhaust valve arranged in the secondary-side gas exhaust flow path, wherein the flow rate controller has a control valve connected to the primary-side valve and the secondary-side valve, and a control-side orifice arranged between the control valve and the secondary-side valve. The gas control method includes: a first operation of opening the primary-side valve and the secondary-side valve of at least one of the gas supply flow paths to supply a gas into the processing chamber; a second operation of closing the primary-side valve and the secondary-side valve that is opened in the first operation; a third operation of opening the primary-side exhaust valve and the secondary-side exhaust valve of the at least one gas supply channel that supplied gas into the processing chamber in the first operation and exhausting the gas from the gas supply flow path; and a fourth operation of closing the primary-side exhaust valve and the secondary-side exhaust valve that is opened in the third operation.

(10) The gas supply method of (9) above further includes: a fifth operation of opening the secondary-side valve and identifying the gas remaining inside the flow rate controller after closing the primary-side exhaust valve and the secondary-side exhaust valve.

(11) In the gas supply method of (9) or (10) above, a cycle including at least the first to fourth operations is repeatedly executed.

(12) There is provided a gas supply method using a gas supply system including: a plurality of gas supply flow paths configured to independently supply a gas to a processing chamber; a flow rate controller arranged in each of the gas supply flow paths; a primary-side valve arranged on the upstream side of the flow rate controller in each of the gas supply flow paths; a primary-side gas exhaust flow path which is branched between the primary-side valve and the flow rate controller in each of the gas supply flow paths and is connected to a primary-side exhaust mechanism; a primary-side exhaust valve arranged in the primary-side gas exhaust flow path; a secondary-side valve arranged on the downstream side of the flow rate controller in each of the gas supply flow paths; a secondary-side gas exhaust flow path which is branched between the secondary-side valve and the flow rate controller in the gas supply flow paths and is connected to a secondary-side exhaust mechanism; and a secondary-side exhaust valve arranged in the secondary-side gas exhaust flow path, wherein the flow rate controller has a control valve connected to the primary-side valve and the secondary-side valve, and a control-side orifice arranged between the control valve and the secondary-side valve. The gas supply method alternately and repeatedly executes: a first operation of supplying a gas into the processing chamber by opening the primary-side valve and the secondary-side valve of the gas supply flow path, and closing the primary-side exhaust valve and the secondary-side exhaust valve; and a second operation of exhaust the gas from the gas supply flow path by opening the primary-side valve and the secondary-side exhaust valve of the gas supply flow path, and closing the primary-side exhaust valve and the secondary-side valve.

(13) In the gas supply method of any one of (9) to (12) above, the flow rate controller includes at least one pressure sensor. The gas supply method includes: supplying a gas into the processing chamber from at least one of the plurality of gas supply flow paths; and performing self-diagnosis for the flow rate controller arranged in another gas supply flow path among the plurality of gas supply flow paths, wherein, when performing the self-diagnosis for the flow rate controller, the gas supply method executes: filling the interior of the flow rate controller arranged in the another gas supply flow path with a gas; opening the secondary-side exhaust valve of the other gas supply channel to exhaust the gas filled into the flow rate controller; and comparing the actual measurement value of an internal pressure drop characteristic of the flow rate controller when the filled gas is exhausted with a drop characteristic of the flow rate controller at the time of shipment.

(14) In the gas supply method of (13) above, the flow rate controller has a plurality of pressure sensors, and wherein, when performing the self-diagnosis for the flow rate controller, the gas supply method further executes: measuring the internal pressure of the flow rate controller after being filled with the gas and the internal pressure of the flow rate controller after the filled gas is exhausted by using the plurality of pressure sensors; and comparing measurement values of internal pressures, which are measured by the plurality of pressure sensors, respectively, with each other.

(15) A gas control system for controlling a supply of gas into a processing chamber, includes: a plurality of gas supply flow paths configured to independently supply a gas to a processing chamber; an orifice arranged in each of the gas supply flow paths; a primary-side valve arranged on an upstream side of the orifice in the gas supply flow path; a primary-side gas exhaust flow path which is branched between the orifice in the gas supply flow path and the primary-side valve and is connected to a primary-side exhaust mechanism; a primary-side exhaust valve arranged in the primary-side gas exhaust flow path; a secondary-side valve arranged on a downstream side of the orifice in the gas supply flow path; a secondary-side gas exhaust flow path which is branched between the orifice in the gas supply flow path and the secondary-side valve and is connected to a secondary-side exhaust mechanism; a secondary-side exhaust valve arranged in the secondary-side gas exhaust flow path; and a controller configured to independently control opening degrees of the primary-side valve, the primary-side exhaust valve, the secondary-side valve, and the secondary-side exhaust valve, wherein the controller is configured to execute: a first control to alternately and repeatedly execute supplying the gas into the processing chamber by opening the primary-side valve and the secondary-side valve and closing the primary-side exhaust valve and the secondary-side exhaust valve, and exhausting the interior of the gas supply flow path by closing the primary-side valve and the secondary-side valve and opening the primary-side exhaust valve and the secondary-side exhaust valve; and a second control to cause the primary-side exhaust mechanism and the secondary-side exhaust mechanism to operate such that the internal pressure of the gas supply flow path is lower than the internal pressure of the processing chamber when exhausting the interior of the gas supply flow path.

(16) A gas control system for controlling a supply of gas into a processing chamber, includes: a gas supply flow path configured to supply a gas to the processing chamber; an orifice arranged in the gas supply flow path; a primary-side valve arranged on an upstream side of the orifice in the gas supply flow path; a primary-side gas exhaust flow path which is branched between the orifice in the gas supply flow path and the primary-side valve and is connected to a primary-side exhaust mechanism; a primary-side exhaust valve arranged in the primary-side gas exhaust flow path; a secondary-side valve arranged on a downstream side of the orifice in the gas supply flow path; a secondary-side gas exhaust flow path which is branched between the orifice in the gas supply flow path and the secondary-side valve and is connected to a secondary-side exhaust mechanism; a secondary-side exhaust valve arranged in the secondary-side gas exhaust flow path; and a controller configured to independently control opening degrees of the primary-side valve, the primary-side exhaust valve, the secondary-side valve, and the secondary-side exhaust valve, wherein the controller is configured to execute: a first control to alternately and repeatedly execute supplying the gas into the processing chamber by opening the primary-side valve and the secondary-side valve and closing the primary-side exhaust valve and the secondary-side exhaust valve, and exhausting the interior of the gas supply flow path by closing the primary-side valve and the secondary-side valve and opening the primary-side exhaust valve and the secondary-side exhaust valve; and a second control to cause the primary-side exhaust mechanism and the secondary-side exhaust mechanism to operate such that at least the gas remains in the interior of the gas supply flow path when exhausting the interior of the gas supply flow path, and wherein an internal pressure of the gas supply flow path after exhaust is 100 Torr or less.

(17) The gas control system of (16) above includes a plurality of gas supply flow paths configured to independently supply a gas to a processing chamber, and the orifice, the primary-side valve, the primary-side exhaust valve, the secondary-side valve, and the secondary-side exhaust valve are arranged in each of the plurality of gas supply flow paths.

(18) In the gas control system of (15) or (17) above, the plurality of gas supply flow paths are connected to the processing chamber after joining to the downstream side of the secondary-side valve.

(19) The gas control system of any one of (15) to (18) above, the gas supply flow path includes a plurality of branch supply pipes configured to independently supply a gas to a plurality of different positions inside the processing chamber, and the secondary-side valve, the secondary-side gas exhaust flow path, and the secondary-side exhaust valve are independently connected to each of the plurality of branch supply pipes.

(20) In the gas control system of (19) above, the gas supply flow path branches into the plurality of branch supply pipes on the downstream side of a connecting portion with the primary-side gas exhaust flow path.

(21) In the gas control system of (19) or (20) above, the plurality of branch supply pipes are configured to independently supply the gas to at least an edge region and a center region of a substrate introduced into the processing chamber.

(22) The gas control system of any one of (15) to (21) above further includes a flow rate controller that configured to control the flow rate of the gas supplied into the processing chamber, wherein the orifice is located inside the flow rate controller, and the primary-side valve, the primary-side exhaust valve, the secondary-side valve, and the secondary-side exhaust valve are arranged outside the flow rate controller.

(23) In the gas control system of (22) above, the flow rate controller further includes an opening-degree regulation valve arranged on the upstream side of the orifice in the gas supply flow path.

(24) The gas control system of any one of (15) to (23) above further includes an installation member configured to integrally interconnect the orifice, the primary-side valve, the primary-side exhaust valve, the secondary-side valve, and the secondary-side exhaust valve.

(25) In the gas control system of any one of (15) to (24) above, the gas is supplied into the processing chamber at a flow rate of 0.1 sccm to 10 sccm.

(26) In the gas control system of any one of (15) to (25) above, the controller is configured to execute a third control to alternately and repeatedly execute a deposition process for forming a deposit on a substrate introduced into the processing chamber and an etching process for etching the substrate, wherein each of the deposition process and the etching process includes supplying a gas into the processing chamber, and exhausting the interior of the gas supply flow path, and wherein one cycle including the deposition process and the etching process has a processing time of 1 second to 10 seconds.

(27) A plasma processing apparatus includes: a processing chamber; a substrate support arranged inside the processing chamber; a gas supplier configured to supply a gas into the processing container; an RF power supply connected to at least the substrate support; and a controller, wherein the gas supplier includes: a plurality of gas supply flow paths configured to independently supply a gas to a processing chamber; an orifice arranged in each of the gas supply flow paths; a primary-side valve arranged on an upstream side of the orifice in the gas supply flow path; a primary-side gas exhaust flow path which is branched between the orifice in the gas supply flow path and the primary-side valve and is connected to a primary-side exhaust mechanism; a primary-side exhaust valve arranged in the primary-side gas exhaust flow path; a secondary-side valve arranged on a downstream side of the orifice in the gas supply flow path; a secondary-side gas exhaust flow path which is branched between the orifice in the gas supply flow path and the secondary-side valve and is connected to a secondary-side exhaust mechanism; a gas control system including a secondary-side exhaust valve arranged in the secondary-side gas exhaust flow path, wherein the controller is configured to execute: a first control to alternately and repeatedly execute supplying the gas into the processing chamber by opening the primary-side valve and the secondary-side valve and closing the primary-side exhaust valve and the secondary-side exhaust valve, and exhausting the interior of the gas supply flow path by closing the primary-side valve and the secondary-side valve and opening the primary-side exhaust valve and the secondary-side exhaust valve; and a second control to cause the primary-side exhaust mechanism and the secondary-side exhaust mechanism to operate such that the internal pressure of the gas supply flow path is lower than the internal pressure of the processing chamber when exhausting the interior of the gas supply flow path.

(28) There is provided a gas control method using a gas control system including: a plurality of gas supply flow paths configured to independently supply a gas to a processing chamber; an orifice arranged in each of the gas supply flow paths; a primary-side valve arranged on an upstream side of the orifice in the gas supply flow path; a primary-side gas exhaust flow path which is branched between the orifice in the gas supply flow path and the primary-side valve and is connected to a primary-side exhaust mechanism; a primary-side exhaust valve arranged in the primary-side gas exhaust flow path; a secondary-side valve arranged on a downstream side of the orifice in the gas supply flow path; a secondary-side gas exhaust flow path which is branched between the orifice in the gas supply flow path and the secondary-side valve and is connected to a secondary-side exhaust mechanism; and a secondary-side exhaust valve arranged in the secondary-side gas exhaust flow path. The gas control method includes: a first operation of opening the primary-side valve and the secondary-side valve of a first gas supply flow path group at least one of which is selected from the plurality of gas supply flow paths and closing the primary-side exhaust valve and the secondary-side exhaust valve of the first gas supply flow path group and the primary-side valve and the secondary-side valve, the primary-side exhaust valve, and the secondary-side exhaust valve of another gas supply flow path; a second operation of opening the primary-side exhaust valve and the secondary-side exhaust valve of the first gas supply flow path group after closing the primary-side valve and the secondary-side valve in the first gas supply flow path group; a third operation of opening the primary-side valve and the secondary-side valve of a second gas supply flow path group, at least one of which is selected from the another gas supply flow path after closing the primary-side exhaust valve and the secondary-side exhaust valve in the first gas supply flow path group; and a fourth operation of opening the primary-side exhaust valve and the secondary-side exhaust valve of the second gas supply flow path group after closing the primary-side valve and the secondary-side valve in the second gas supply flow path group.

(29) In the gas control method of (28) above, a first process including the first operation and the second operation and a second process including the third operation and the fourth operation are alternately and repeatedly executed.

(30) A gas control system for controlling a supply of gas into a processing chamber, includes: a gas supply flow path configured to supply a gas to the processing chamber; an orifice arranged in the gas supply flow path; a flow rate control valve arranged on an upstream side of the orifice in the gas supply flow path; a primary-side valve arranged on an upstream side of the flow rate control valve in the gas supply flow path; a secondary-side valve arranged on a downstream side of the orifice in the gas supply flow path; a secondary-side gas exhaust flow path which is branched between the orifice in the gas supply flow path and the secondary-side valve and is connected to a secondary-side exhaust mechanism; and a secondary-side exhaust valve arranged in the secondary-side gas exhaust flow path; and a controller configured to independently control opening degrees of the flow rate control valve, the primary-side valve, the secondary-side valve, and the secondary-side exhaust valve, wherein the controller is configured to execute: a first control to alternately and repeatedly execute supplying the gas into the processing chamber by opening the flow rate control valve, the primary-side valve, and the secondary-side valve and closing the primary-side exhaust valve and the secondary-side exhaust valve, and exhausting the interior of the gas supply flow path by closing the flow rate control valve, the primary-side valve, and the secondary-side valve and opening the primary-side exhaust valve and the secondary-side exhaust valve; and in the supplying of the gas; and a second control to open the flow rate control valve and the primary-side valve before the secondary-side valve and to open the secondary-side valve after filling the gas to the downstream side of the orifice.

(31) In the gas control system of (30) above, the controller is configured to open the secondary-side valve after a pressure on the downstream side of the orifice is increased to a predetermined reference pressure in the supplying of the gas.

(32) In the gas control system of (31) above, the reference pressure is 80% or more and 120% or less of the pressure on the downstream side of the secondary-side valve.

(33) In the gas control system of (30) above, the control unit is configured to determine the timing of opening the secondary-side valve by using at least one parameter selected from among the pressure on the downstream side of the orifice, the flow rate of a gas flowing through the gas supply flow path, the gas supply time, the internal temperature of the gas supply flow path, and the flow rate of another gas flowing through the downstream side of the secondary-side valve.

(34) In the gas control system of any one of (30) to (33) above, the controller is configured to execute filling of the gas at a flow rate determined prior to filling the downstream side of the orifice with the gas.

(35) In the gas control system of any one of (30) to (33) above, the gas supply flow path is configured to independently supply the gas to different regions within the processing chamber, and the control unit executes filling of the gas at the flow rate determined by using at least one parameter selected from among the flow rate of another gas flowing through the downstream side of the secondary-side valve, the temperature of the processing chamber, the flow rate ratio of gases supplied to each of the different regions, and the pressure on the downstream side of the orifice.

(36) The gas control system of any one of (30) to (33) above includes a flow rate controller configured to control the pressure on the downstream side of the orifice and to control the flow rate of the gas supplied into the processing chamber.

(37) In the gas control system of (36) above, the orifice is located inside the flow rate controller.

(38) The gas control system of any one of (30) to (37) above includes a primary-side gas exhaust flow path which is branched between the orifice in the gas supply flow path and the primary-side valve and is connected to a primary-side exhaust mechanism, and a primary-side exhaust valve arranged in the primary-side gas exhaust flow path.

(39) The gas control system of any one of (30) to (38) above includes a plurality of gas supply flow paths configured to independently supply a gas to a processing chamber.

(40) In the gas control system of (39) above, different types of gas are independently supplied to the plurality of gas supply flow paths, respectively, and the controller is configured to execute a third control to omit the exhausting of the interior of the gas supply flow path, depending on the internal pressure of the gas supply flow path.

(41) A plasma processing apparatus includes: a processing chamber; a substrate support arranged inside the processing chamber; a gas supplier configured to supply a gas into the processing container; an RF power supply connected to at least the substrate support; and a controller, wherein the plasma processing apparatus further includes: a gas supply flow path configured to supply a gas to the processing chamber; an orifice arranged in the gas supply flow path; a flow rate control valve arranged on an upstream side of the orifice in the gas supply flow path; a primary-side valve arranged on an upstream side of the flow rate control valve in the gas supply flow path; a secondary-side valve arranged on a downstream side of the orifice in the gas supply flow path; a secondary-side gas exhaust flow path which is branched between the orifice in the gas supply flow path and the secondary-side valve and is connected to a secondary-side exhaust mechanism; and a secondary-side exhaust valve arranged in the secondary-side gas exhaust flow path, wherein the controller is configured to execute: a first control to alternately and repeatedly execute supplying the gas into the processing chamber by opening the flow rate control valve, the primary-side valve, and the secondary-side valve and closing the primary-side exhaust valve and the secondary-side exhaust valve, and exhausting the interior of the gas supply flow path by closing the flow rate control valve, the primary-side valve, and the secondary-side valve and opening the primary-side exhaust valve and the secondary-side exhaust valve; and in the supplying of the gas; and a second control to open the flow rate control valve and the primary-side valve before the secondary-side valve and to open the secondary-side valve after filling the gas to the downstream side of the orifice.

(42) There is provided a method of performing plasma processing on a substrate by using a gas control system including: a gas supply flow path configured to supply a gas to the processing chamber configured to accommodate the substrate; an orifice arranged in the gas supply flow path; a flow rate control valve arranged on an upstream side of the orifice in the gas supply flow path; a primary-side valve arranged on an upstream side of the flow rate control valve in the gas supply flow path; a secondary-side valve arranged on a downstream side of the orifice in the gas supply flow path; a secondary-side gas exhaust flow path which is branched between the orifice in the gas supply flow path and the secondary-side valve and is connected to a secondary-side exhaust mechanism; and a secondary-side exhaust valve arranged in the secondary-side gas exhaust flow path. The method alternately and repeatedly executes a first operation of alternately and repeatedly executing supplying the gas into the processing chamber by opening the flow rate control valve, the primary-side valve, and the secondary-side valve and closing the primary-side exhaust valve and the secondary-side exhaust valve, and a second operation of exhausting the interior of the gas supply flow path by closing the flow rate control valve, the primary-side valve, and the secondary-side valve and opening the primary-side exhaust valve and the secondary-side exhaust valve, and wherein, in the operation (B), the flow rate control valve and the primary-side valve are opened before the secondary-side valve and the secondary-side valve is opened after filling the gas to the downstream side of the orifice.

According to the present disclosure, it is possible to appropriately exhaust gas from an interior of a flow rate controller that controls a flow rate of the gas supplied into a processing chamber.

Although the present disclosure has been described with reference to illustrative embodiments, this description is not intended to be construed in a limiting sense. Various modifications and combinations of the illustrative embodiments, as well as other embodiments of the present disclosure, will be apparent to a person ordinarily skilled in the art upon reference to the description. For example, the embodiments illustrated in FIGS. 3 to 18 may be combined with those illustrated in FIGS. 19 to 25 to the extent that they are not contradictory. Accordingly, the appended claims are intended to cover any such modifications or embodiments.

What is claimed is:

1. A gas supply system for supplying gas into a processing chamber, the gas supply system comprising:
- a plurality of gas supply flow paths configured to independently supply the gas to the processing chamber;
- a flow rate controller arranged in each of the plurality of gas supply flow paths;
- a primary-side valve arranged on an upstream side of the flow rate controller in each of the plurality of gas supply flow paths;
- a primary-side gas exhaust flow path which is branched between the primary-side valve and the flow rate controller in each of the plurality of gas supply flow paths and is connected to a primary-side exhaust mechanism;
- a primary-side exhaust valve arranged in the primary-side gas exhaust flow path;
- a secondary-side valve arranged on a downstream side of the flow rate controller in each of the plurality of gas supply flow paths;
- a secondary-side gas exhaust flow path which is branched between the secondary-side valve and the flow rate controller in each of the plurality of gas supply flow paths and is connected to a secondary-side exhaust mechanism; and
- a secondary-side exhaust valve arranged in the secondary-side gas exhaust flow path,
- wherein the flow rate controller includes:
  - a control valve connected to the primary-side valve and the secondary-side valve; and
  - a control-side orifice arranged between the control valve and the secondary-side valve.

2. The gas supply system of claim 1, further comprising:
- an exhaust-side orifice arranged on an upstream side of the secondary-side exhaust valve in the secondary-side gas exhaust flow path; and
- a chamber-side orifice arranged between a connection portion of each of the plurality of gas supply flow paths with the secondary-side gas exhaust flow path and the secondary-side valve,
- wherein the control-side orifice has a hole diameter of a minimum process limitation, and
- wherein the exhaust-side orifice and the chamber-side orifice have different hole diameters.

3. The gas supply system of claim 2, wherein a ratio of the hole diameters of the exhaust-side orifice and the chamber-side orifice is determined based on a ratio of a target flow rate supplied to the processing chamber to a flow rate of a gas output from the control-side orifice.

4. The gas supply system of claim 1, wherein the plurality of gas supply flow paths are connected to the processing chamber after being joined at a downstream side of the secondary-side valve.

5. The gas supply system of claim 1, wherein each of the plurality of gas supply flow paths includes a plurality of branch supply pipes configured to independently supply the gas to a plurality of different positions inside the processing chamber, and wherein the flow rate controller, the secondary-side valve, the secondary-side gas exhaust flow path, and the secondary-side exhaust valve are independently connected to each of the plurality of branch supply pipes.

6. The gas supply system of claim 5, wherein each of the plurality of gas supply flow paths branches into the plurality of branch supply pipes between a connection portion with the primary-side gas exhaust flow path and the flow rate controller.

7. The gas supply system of claim 5, wherein the plurality of branch supply pipes are configured to independently supply the gas to at least an edge region and a center region of a substrate introduced into the processing chamber.

8. A gas supply system for supplying gas into a processing chamber, the gas supply system comprising:

a plurality of gas supply flow paths configured to independently supply the gas to the processing chamber;

a flow rate controller arranged in each of the plurality of gas supply flow paths;

a primary-side valve arranged on an upstream side of the flow rate controller in each of the plurality of gas supply flow paths;

a primary-side gas exhaust flow path which is branched between the flow rate controller and the primary-side valve in each of the plurality of gas supply flow paths and is connected to a primary-side exhaust mechanism;

a primary-side exhaust valve arranged in the primary-side gas exhaust flow path; and a secondary-side valve arranged on a downstream side of the flow rate controller in each of the plurality of gas supply flow paths, wherein the flow rate controller includes:

a control valve connected to the primary-side valve and the secondary-side valve; and a control-side orifice arranged between the control valve and the secondary-side valve.

9. A plasma processing apparatus for processing a substrate, the plasma processing apparatus comprising:

a processing chamber;

a substrate support arranged inside the processing chamber;

the gas supply system of claim 1 configured to supply a gas into the processing chamber; and a plasma generator configured to generate plasma from the gas in the processing chamber.

10. A plasma processing apparatus for processing a substrate, the plasma processing apparatus comprising:

a processing chamber;

a substrate support arranged inside the processing chamber;

the gas supply system of claim 8 configured to supply a gas into the processing chamber; and a plasma generator configured to generate plasma from the gas in the processing chamber.

11. A gas control system for controlling a supply of gas into a processing chamber, the gas control system comprising:

a gas supply flow path configured to supply the gas to the processing chamber;

an orifice arranged in the gas supply flow path;

a primary-side valve arranged on an upstream side of the orifice in the gas supply flow path;

a primary-side gas exhaust flow path which is branched between the orifice in the gas supply flow path and the primary-side valve and is connected to a primary-side exhaust mechanism;

a primary-side exhaust valve arranged in the primary-side gas exhaust flow path;

a secondary-side valve arranged on a downstream side of the orifice in the gas supply flow path;

a secondary-side gas exhaust flow path which is branched between the orifice in the gas supply flow path and the secondary-side valve and is connected to a secondary-side exhaust mechanism;

a secondary-side exhaust valve arranged in the secondary-side gas exhaust flow path; and a controller configured to independently control opening degrees of the primary-side valve, the primary-side exhaust valve, the secondary-side valve, and the secondary-side exhaust valve, wherein the controller is configured to execute:

a first control to alternately and repeatedly execute supplying the gas into the processing chamber by opening the primary-side valve and the secondary-side valve and closing the primary-side exhaust valve and the secondary-side exhaust valve, and exhausting an interior of the gas supply flow path by closing the primary-side valve and the secondary-side valve and opening the primary-side exhaust valve and the secondary-side exhaust valve; and a second control to cause the primary-side exhaust mechanism and the secondary-side exhaust mechanism to operate such that at least the gas remains in the interior of the gas supply flow path when exhausting the interior of the gas supply flow path, and wherein an internal pressure of the gas supply flow path after the exhausting is 100 Torr or less.

12. The gas control system of claim 11, wherein the gas control system comprises a plurality of gas supply flow paths configured to independently supply the gas to the processing chamber, and wherein the orifice, the primary-side valve, the primary-side exhaust valve, the secondary-side valve, and the secondary-side exhaust valve are arranged in each of the plurality of gas supply flow paths.

13. The gas control system of claim 11, further comprising:

a flow rate controller configured to control a flow rate of the gas supplied into the processing chamber, wherein the orifice is located inside the flow rate controller, and wherein the primary-side valve, the primary-side exhaust valve, the secondary-side valve, and the secondary-side exhaust valve are arranged outside the flow rate controller.

14. The gas control system of claim 13, wherein the flow rate controller further includes an opening-degree regulation valve arranged on the upstream side of the orifice in the gas supply flow path.

15. The gas control system of claim 11, further comprising:

an installation member configured to integrally interconnect the orifice, the primary-side valve, the primary-side exhaust valve, the secondary-side valve, and the secondary-side exhaust valve.

16. The gas control system of claim 11, wherein the gas is supplied into the processing chamber at a flow rate of 0.1 sccm to 10 sccm.

17. The gas control system of claim 11, wherein the controller is configured to execute a third control to alternately and repeatedly execute a deposition process of forming a deposit on a substrate introduced into the processing chamber and an etching process of etching the substrate, wherein each of the deposition process and the etching process includes supplying the gas into the processing chamber, and exhausting the interior of the gas supply flow path, and wherein one cycle including the deposition process and the etching process has a processing time of 1 second to 10 seconds.

* * * * *